(12) United States Patent
Arima et al.

(10) Patent No.: US 8,811,559 B1
(45) Date of Patent: Aug. 19, 2014

(54) TIMING RECOVERY CIRCUIT AND RECEIVER CIRCUIT INCLUDING THE SAME

(71) Applicant: Panasonic Corporation, Osaka (JP)

(72) Inventors: Yukio Arima, Kyoto (JP); Akinori Shinmyo, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/257,849

(22) Filed: Apr. 21, 2014

Related U.S. Application Data

(63) Continuation of application No. PCT/JP2012/002429, filed on Apr. 6, 2012.

(30) Foreign Application Priority Data

Nov. 4, 2011 (JP) .................................. 2011-242068

(51) Int. Cl.
*H03D 3/24* (2006.01)
*H04L 7/02* (2006.01)
*H04L 7/00* (2006.01)

(52) U.S. Cl.
CPC .................................. H04L 7/0041 (2013.01)
USPC ........................... 375/373; 375/355; 375/359

(58) Field of Classification Search
USPC .................................. 375/355, 359, 371, 373
See application file for complete search history.

(56) References Cited

U.S. PATENT DOCUMENTS

| 7,167,534 B2 | 1/2007 | Nakamura |
| 2002/0176527 A1 | 11/2002 | Nakamura |
| 2003/0210758 A1* | 11/2003 | Lee et al. ....................... 375/371 |
| 2006/0188051 A1* | 8/2006 | Donnelly et al. ............. 375/371 |
| 2007/0047686 A1 | 3/2007 | Aoki et al. |
| 2007/0160173 A1* | 7/2007 | Takeuchi ....................... 375/355 |
| 2008/0094109 A1* | 4/2008 | Farjad-rad et al. .............. 327/99 |
| 2009/0052599 A1 | 2/2009 | Yanagisawa et al. |
| 2009/0245449 A1 | 10/2009 | Umai et al. |
| 2010/0239059 A1 | 9/2010 | Sugimoto et al. |
| 2011/0102028 A1 | 5/2011 | Nedachi |

FOREIGN PATENT DOCUMENTS

| JP | 2009-239768 A | 10/2009 |
| JP | 2011-097314 A | 5/2011 |

OTHER PUBLICATIONS

International Search Report issued in the International Application No. PCT/JP2012/002429 with Date of mailing May 15, 2012, with English Translation.

* cited by examiner

*Primary Examiner* — David B Lugo
(74) *Attorney, Agent, or Firm* — McDermott Will & Emery LLP

(57) ABSTRACT

A timing recovery circuit includes a clock generation circuit which generates clock signals having different periods in different modes, i.e., a first and a second operation mode, phase interpolation circuits each of which outputs a sample timing signal having a phase adjusted to fall between the phases of two clock signals in the first operation mode, and outputs one of the two clock signals as a sample timing signal in the second operation mode, sampler circuits which latch a data signal using the sample timing signals, and a phase control circuit which gives an instruction to select a clock signal or adjust the phase of a sample timing signal.

10 Claims, 13 Drawing Sheets

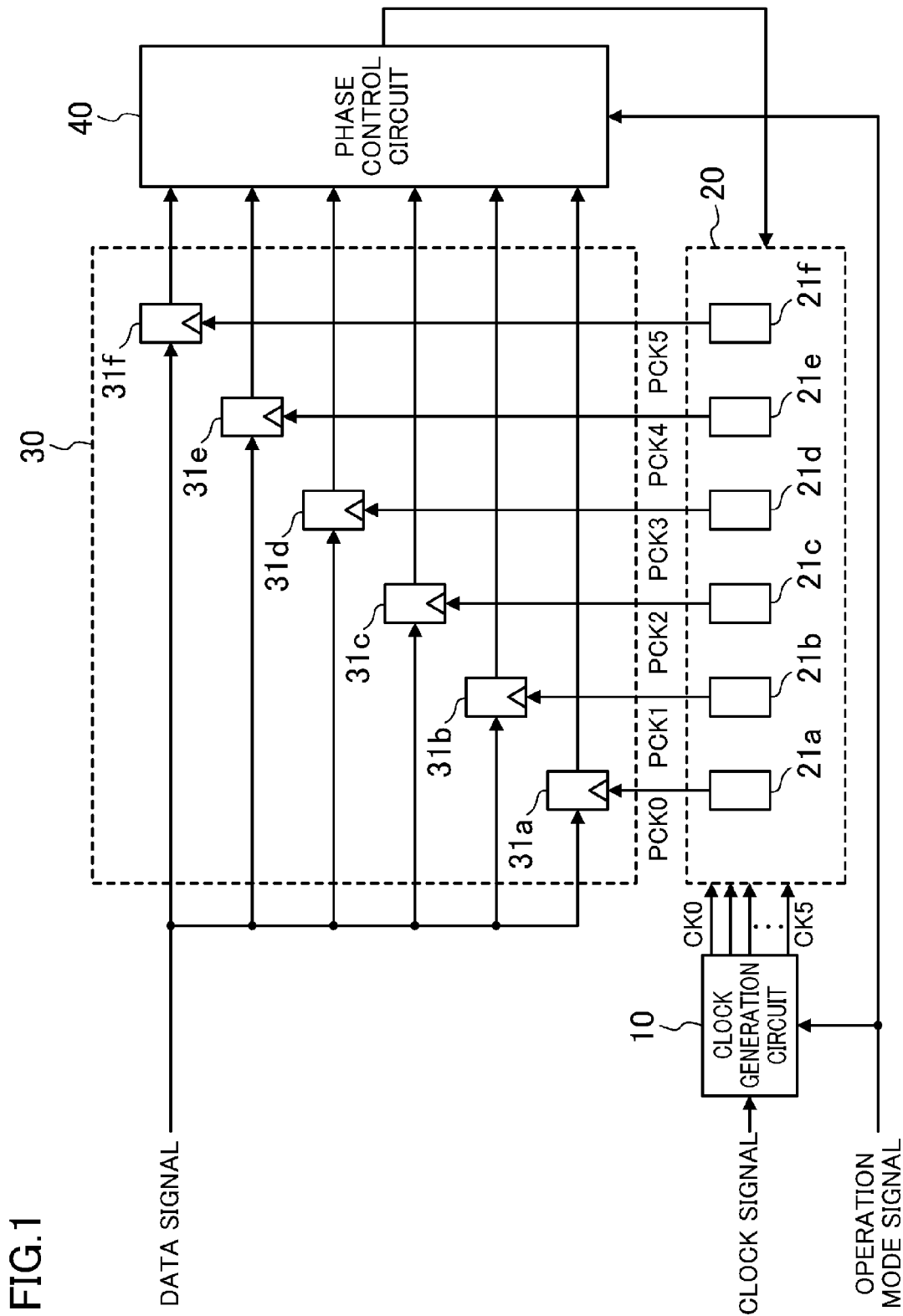

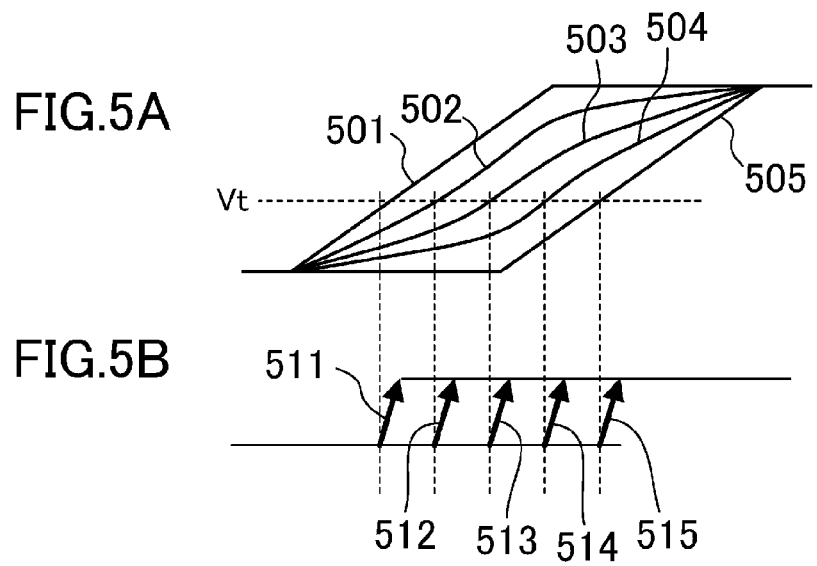
FIG.5A
FIG.5B
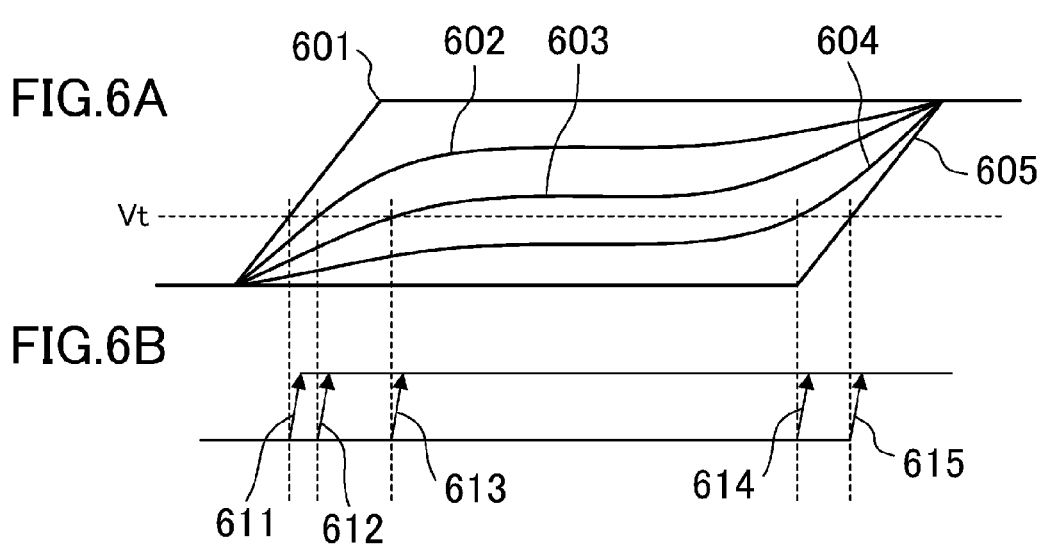
FIG.6A
FIG.6B

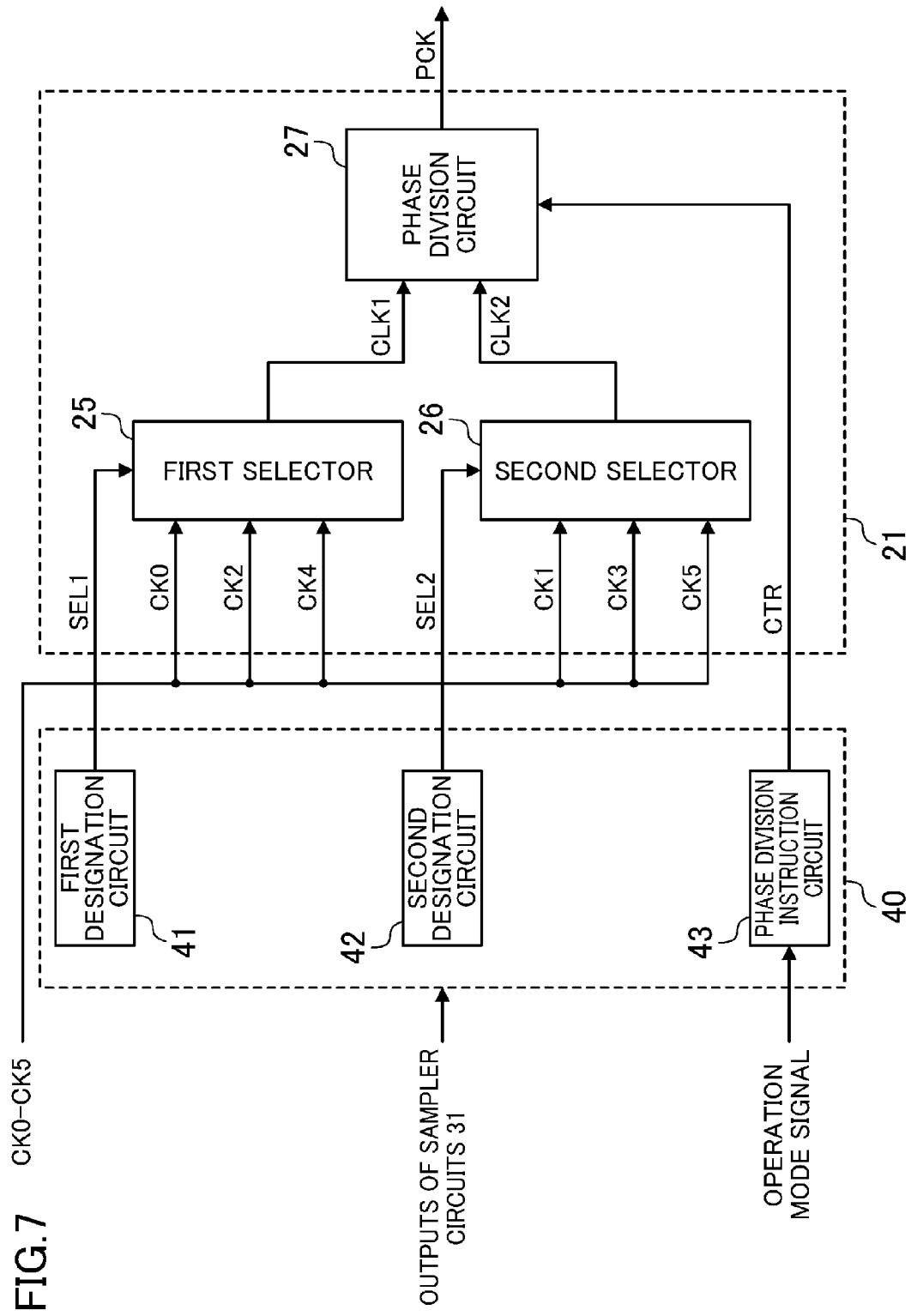

TIMING RECOVERY CIRCUIT AND RECEIVER CIRCUIT INCLUDING THE SAME

CROSS-REFERENCE TO RELATED APPLICATIONS

This is a continuation of International Application No. PCT/JP2012/002429 filed on Apr. 6, 2012, which claims priority to Japanese Patent Application No. 2011-242068 filed on Nov. 4, 2011. The entire disclosures of these applications are incorporated by reference herein.

BACKGROUND

The present disclosure relates to timing recovery circuits, and more particularly, to a timing recovery circuit which can handle a broader band.

For example, when devices connected to a network perform data communication with each other, the clock of the receiver device is often not synchronous with the clock of the transmitter device, and in addition, the clocks often do not have the same frequency, because of a difference in an operating environment, such as power supply noise, temperature, etc. Therefore, in order to allow for data communication between these devices, the receiver device needs to perform a synchronization process based on received data. This process is commonly called "timing recovery," "clock data recovery," etc.

In typical timing recovery, the receiver generates a clock for receiving data, detects a phase difference between the clock and received data, and adjusts the phase of the clock based on the detected phase difference to generate a clock having a phase suitable for reception of data. As the transmission rate of data increases, it is more difficult to accurately detect the phase difference between the data and the clock. Therefore, typically, in timing recovery which can handle a high transmission rate, 1-bit data is sampled in synchronization with a plurality of clocks having different phases (this process is called "oversampling"). By detecting changes in values of data sampled according to the clocks, differences between the phase of data and the phases of the clocks are determined. A clock phase control is performed based on the differences.

Typically, an interpolator is used for a phase control. The interpolator generates a clock having an intermediate phase between the phases of two reference clocks. Therefore, the interpolator is advantageous in generating clocks having any phases based on a few reference clocks, instead of previously preparing a large number of clocks having different phases.

As the speed of data communication has in recent years been increased, there has been a demand for an interface for a broader band. For example, a digital video signal interface such as high-definition multimedia interface (HDMI) needs to handle a considerably wide range of transmission rates because the transmission rate may range from several hundred Mbps to several Gbps, depending on the number of pixels or color depth of a display device. If timing recovery is implemented by phase determination employing oversampling and a phase control employing an interpolator, the timing recovery can work properly when the transmission rate is high. However, in general, it is disadvantageously difficult to obtain an output clock having a desired phase using an interpolator when the frequency of the reference clock is low.

In order to provide a broader-band interface, it is necessary to ensure accurate timing recovery in a low frequency region as well. Japanese Unexamined Patent Publication No. 2011-97314 describes timing recovery which can handle a broadband by broadening the operating range of an interpolator. In the technique of Japanese Unexamined Patent Publication No. 2011-97314, the slew rate of a reference clock is controlled by changing the on-resistance of a pass gate transistor. Specifically, when the clock frequency is high, the on-resistance is reduced. Conversely, when the clock frequency is low, the on-resistance is increased. As a result, the operating range of the interpolator is broadened.

However, in the technique of Japanese Unexamined Patent Publication No. 2011-97314, it is difficult to provide an interface which can handle frequencies which differ from each other by a factor of 10-100. Such an interface has in recent years been demanded.

FIG. 14 is a diagram showing a configuration of a conventional timing recovery circuit (see, for example, Japanese Unexamined Patent Publication No. 2009-239768). This timing recovery circuit can handle a broader band by dividing the frequency of an output clock of an interpolator instead of broadening the operating range of an interpolator itself.

Specifically, a PLL 801 outputs multiple-phase clocks Mulclk having a frequency which is constant irrespective of the transmission rate of data. An interpolator 802 generates a clock Compclk whose phase is set based on a phase control signal sig3 using the clocks Mulclk as a reference clock. The clock Compclk has the same frequency as that of the clocks Mulclk. A frequency division circuit 803 generates a clock Rclk having a frequency suitable for the data transmission rate. The frequency division circuit 803 performs frequency division operation in synchronization with the clock Compclk, and therefore, can reduce the frequency of the clock Rclk while maintaining the phase of the clock Compclk.

A phase determination circuit 804 compares the phases of the clock Rclk and data DATA, and outputs a signal sig1 as a result of the phase comparison. A filter 805 outputs a signal sig2 as a result of smoothing the signal sig1. A pointer circuit 806 updates the value of the phase control signal sig3 based on the signal sig2. Thus, timing recovery is achieved.

In this timing recovery circuit, it is not necessary to limit the operating range of the interpolator 802. If the frequency of the clocks Mulclk is set within the operating range of the interpolator 802, a clock having a frequency suitable for the transmission rate can be generated by only setting the frequency division ratio of the frequency division circuit 803. Therefore, timing recovery which can handle a broader frequency range can be achieved.

SUMMARY

However, in the conventional timing recovery circuit, when the data transmission rate is low, the phase tracking performance of timing recovery is likely to decrease. FIG. 15 is a timing chart showing a case where the PLL 801 outputs two-phase clocks and the interpolator 802 divides the interval between the clock phases into four.

In FIG. 15, reference characters 901*a* and 901*b* indicate waveforms of the two-phase clocks Mulclk output by the PLL 801. If the transmission rate of data is ¹⁄₁₀ of the frequency of the clocks Mulclk, the frequency division circuit 803 divides the frequency of the clock Compclk by 10 to output the resultant clock Rclk. The interpolator 802 divides the interval between the phases of the clocks 901*a* and 901*b* into four. Therefore, if the pointer circuit 806 continues to send, to the interpolator 802, an instruction to successively delay the phase of the clock Compclk, the phase of the clock Rclk ideally should transition like 902*a*→902*b*→902*c*→902*d*→902*e*. However, actually, the phase of the clock Rclk transitions like 903a→903b→903c→903d→903e, and therefore, the phase tracking performance is reduced by a factor of 10.

Japanese Unexamined Patent Publication No. 2009-239768 supra also describes a configuration in which, in order to reduce or avoid such a reduction in phase tracking performance, the frequency of the clock Rclk is divided by another frequency division circuit so that clocks having different frequencies are supplied to the filter 805 and the pointer circuit 806. For example, it is assumed that a clock supplied to the pointer circuit 806 has a frequency which is 10 times as high as that of a clock supplied to the filter 805. In this case, the phase control signal sig3 is output 10 times while the signal sig2 is output once. Therefore, the phase tracking performance can be increased by a factor of 10. However, in this technique, it is necessary to provide a plurality of frequency division circuits, and it is also necessary to reduce or prevent the occurrence of a glitch in the clock Compclk when the phase is successively changed. Also, although the phase tracking performance is increased by a factor of 10, a wait time exists between each output of the phase control signal sig3, and therefore, it takes a long time to obtain an ideal phase. Also, because the frequency division ratio of the frequency division circuit is basically a unit fraction (the reciprocal of an integer), it is difficult to achieve timing recovery when the transmission rate is not equal to any unit fraction of the maximum transmission rate which is permitted by the timing recovery circuit.

The present disclosure describes implementations of a timing recovery circuit which can handle a broader transmission rate range while maintaining good phase tracking performance.

An example timing recovery circuit for controlling a timing of latching a received data signal, the timing recovery circuit being allowed to switch between a first operation mode and a second operation mode, includes a clock generation circuit configured to generate n clock signals having phases separated by T/n from each other, where T is the period of the n clock signals, n is an integer of D or more, and D is an integer of two or more, wherein the period T is D times as long as the 1-bit length of the data signal in the first operation mode and is equal to the 1-bit length of the data signal in the second operation mode, at least D phase interpolation circuits each configured to select two of the n clock signals as a first and a second clock signal, and generate a sample timing signal having a phase adjusted to fall between the phases of the first and second clock signals in the first operation mode, and output one of the first and second clock signals as a sample timing signal in the second operation mode, a plurality of sampler circuits provided, respectively corresponding to the at least D phase interpolation circuits, and each configured to latch the data signal in synchronization with the sample timing signal output from a corresponding one of the at least D phase interpolation circuits, and a phase control circuit configured to determine the phases of the sample timing signals based on outputs of the plurality of sampler circuits, and instruct the at least D phase interpolation circuits to select the first and second clock signals based on the result of the phase determination, and instruct the at least D phase interpolation circuits to adjust the phases of the sample timing signals in the first operation mode, and to select one of the first and second clock signals in the second operation mode.

This configuration allows the timing recovery circuit to operate in the different operation modes, depending on the transmission rate of the data signal. For example, the timing recovery circuit may operate in the first operation mode when the transmission rate is high, and in the second operation mode when the transmission rate is low.

In the first operation mode, the phase interpolation circuit selects a first and a second clock signal from a plurality of clock signals which have a period longer than the 1-bit length of the data signal and phases separated by T/n from each other, and adjusts the phase of the sample timing signal with reference to the clock signals. The phase control circuit determines the phases of the sample timing signals based on the result of latching of the data signal performed by the sampler circuits, and based on the result of the phase determination, instructs each of the phase determination circuits to select the first and second clock signals and adjust the phase of the sample timing signal.

Therefore, in timing recovery operation performed when the transmission rate is high, the phase of the sample timing signal can be adjusted to fall between the phases of the first and second clock signals.

On the other hand, in the second operation mode, the phase interpolation circuit selects a first and a second clock signal from a plurality of clock signals which have a period equal to the 1-bit period of the data signal and phases separated by T/n from each other, and outputs one of the first and second clock signals as a sample timing signal. The phase control circuit instructs each of the phase interpolation circuits to select the first and second clock signals and select one of the first and second clock signals based on the result of the phase determination.

Therefore, in timing recovery operation which is performed when the transmission rate is low, the amount of a change in the phase of the sample timing signal is at least T/n, and therefore, the phase tracking performance can be maintained high.

As a result, timing recovery operation which can handle a broader-band transmission rate can be achieved while maintaining good phase tracking performance even when the transmission rate is low.

When the transmission rate is low, the phase of the sample timing signal is changed by at least T/n by the phase control circuit giving an instruction to the phase interpolation circuit once, and therefore, the time it takes to obtain a sample timing signal having a desired phase can be reduced.

A frequency division circuit is not needed. Therefore, the circuit area of the timing recovery circuit does not increase, and the transmission rate which can be handled by the timing recovery circuit is not limited by the frequency division ratio.

The timing recovery circuit includes a first to an n-th phase interpolation circuit, where n is an integer multiple of D, as the at least D phase interpolation circuits, a first to an n-th sampler circuit as the plurality of sampler circuits, and a phase conversion circuit configured to directly relay the instruction from the phase control circuit in the first operation mode, and convert the instruction from the phase control circuit in the second operation mode. In the first operation mode, for D sampler circuit groups including n/D sampler circuits, the phase control circuit performs the phase determination in parallel, D bits at a time, using outputs of the sampler circuits included in each of the sampler circuit groups, and based on the result of the phase determination, instructs the first to n-th phase interpolation circuits to select two clock signals having phases separated by T/n from each other as the first and second clock signals. In the second operation mode, the phase control circuit performs the phase determination, one bit at a time, using outputs of the n/D sampler circuits included in any of the D sampler circuit groups, and based on the result of the phase determination, instructs n/D phase interpolation circuits corresponding to the n/D sampler circuits involved in the phase determination to select two clock signals having phases separated by T/n from each other as the first and second clock signals, and output the sample timing signals having phases separated by T/n from each other. In the second operation mode, the phase conversion circuit converts the instruction from the phase control circuit to (n/D−1) of the n/D phase interpolation circuits so the n/D phase interpolation circuits designated by the phase control circuit output the sample timing signals having phases separated by D×T/n from each other.

The timing recovery circuit includes a first to an m-th phase interpolation circuit, where m is an integer of D or more, as the at least D phase interpolation circuits, a first to an m-th sampler circuit as the plurality of sampler circuits, and a phase conversion circuit configured to directly relay the instruction from the phase control circuit in the first operation mode, and convert the instruction from the phase control circuit in the second operation mode. In the first operation mode, the phase control circuit performs the phase determination based on outputs of the first to m-th sampler circuits, and based on the result of the phase determination, instructs the first to m-th phase interpolation circuits to select two clock signals having phases separated by T/n from each other as the first and second clock signals. In the second operation mode, the phase control circuit performs the phase determination based on outputs of the (m−2)th to m-th sampler circuits, and based on the result of the phase determination, instructs the (m−2)th to m-th phase interpolation circuits to select two clock signals having phases separated by T/n from each other as the first and second clock signals, and output the sample timing signals having phases separated by T/n from each other. In the second operation mode, the phase conversion circuit converts the instruction from the phase control circuit to the (m−1)th and m-th phase interpolation circuits so the (m−2)th to m-th phase interpolation circuits output the sample timing signals having phases separated by an integer multiple of T/n from each other.

The above configurations allow for phase determination using the outputs of the same sampler circuits in both of the first and second operation modes.

According to the present disclosure, a timing recovery circuit can be provided which can handle a broader-band transmission rate while maintaining good phase tracking performance even when the transmission rate is low.

BRIEF DESCRIPTION OF THE DRAWINGS

FIG. 1 is a diagram showing a configuration of a timing recovery circuit according to a first embodiment.

FIGS. 5A and 5B are diagrams showing waveforms of input and output signals of an output buffer shown in FIG. 4.

FIGS. 6A and 6B are diagrams showing waveforms of input and output signals of an output buffer according to a comparative example.

FIG. 7 is a diagram showing an example configuration of a phase control circuit and a phase interpolation circuit according to a variation.

DETAILED DESCRIPTION

Figure 2A:
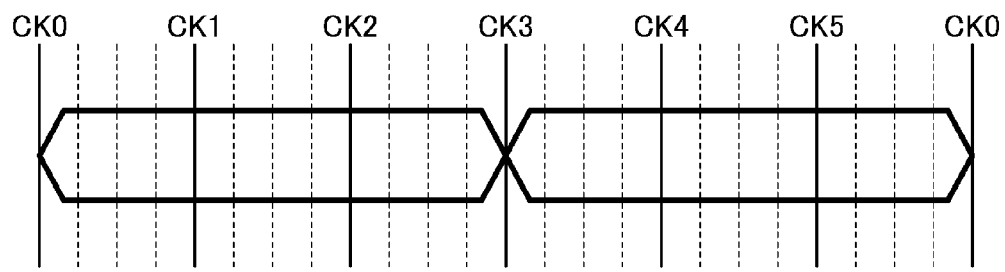
FIGS. 2A and 2B are timing charts showing a relationship between a data signal and clock signals.

In timing recovery circuits according to embodiments described below, it is assumed that the 1-bit length of a data signal is P and the oversampling rate is "3" for the sake of convenience unless otherwise specified. Also, it is assumed that when the transmission rate of the data signal is high, a phase determination process is performed on the data signal in parallel, two bits at a time, and when the transmission rate of the data signal is low, a phase determination process is performed on the data signal, one bit at a time.

First Embodiment

FIG. 1 is a diagram showing a configuration of a timing recovery circuit according to a first embodiment. The timing recovery circuit includes a clock generation circuit 10, a phase interpolation circuit group 20, a sampler circuit group 30, and a phase control circuit 40. The timing recovery circuit can change operations, depending on an operation mode signal.

The clock generation circuit 10 multiplies the frequency of a received clock signal to generate a plurality of clock signals CK0-CK5 having different phases. The factor by which the frequency of the clock signal is multiplied is determined based on the value of the operation mode signal. The operation mode signal takes a low value ("L") or a high value ("H"), for example.

When the operation mode signal is low, which indicates a first operation mode (hereinafter indicated by "L"), the operation mode signal indicates that the transmission rate of the data signal is, for example, 3 Gbps or more, i.e., the transmission rate is high. Because the 1-bit length of the data signal is P, if the periods of the clock signals CK0-CK5 are T, then when the operation mode is "L," the period T=(P×the number of bits of the data signal which are processed in parallel)=2P. Here, the number of bits of the data signal which are processed in parallel refers to the number of bits involved in a phase determination process described below. The interval in phase between each of the clock signals CK0-CK5 is represented by P/(the oversampling rate). The number of clock signals generated by the clock generation circuit 10 is represented by (the number of bits of the data signal which are processed in parallel)×(the oversampling rate). Therefore, the clock generation circuit 10, when the operation mode is "L," outputs the six clock signals CK0-CK5 which have a frequency of 1/T and different phases which are separated by T/6 from each other. Note that the clock generation circuit 10 may output six or more clock signals.

On the other hand, when the operation mode signal is high, which indicates a second operation mode (hereinafter indicated by "H"), the operation mode signal indicates that the transmission rate is lower than when the operation mode is "L." In this case, the clock generation circuit 10 generates the clock signals CK0-CK5 whose period T is equal to P. The clock signals CK0-CK5 each have a frequency of 1/T. The interval in phase between each of the clock signals CK0-CK5 is represented by T/((the oversampling rate)×(the number of bits of the data signal which are processed in parallel when the operation mode is "L")). The number of clock signals generated by the clock generation circuit 10 is represented by (the number of bits of the data signal which are processed in parallel when the operation mode is "L")×(the oversampling rate). Therefore, the clock generation circuit 10, when the operation mode is "H," outputs the six clock signals CK0-CK5 which have a frequency of 1/T and different phases which are separated by T/6 from each other.

The reference characters CK0, CK1, CK2, . . . , and CK5 of the six clock signals CK0-CK5 thus output are assumed to be in order of phase with the most advanced phase first.

The phase interpolation circuit group 20 includes, for example, six phase interpolation circuits 21a-21f. The phase interpolation circuits 21a-21f generate and output clock signals PCK0-PCK5 as sample timing signals based on the clock signals CK0-CK5, respectively. The phase interpolation circuits 21a-21f have a similar configuration, and therefore, a configuration of the phase interpolation circuit 21a will be described.

The phase interpolation circuit 21a selects two of the clock signals CK0-CK5 as reference clocks. The phase interpolation circuit 21a, when the operation mode is "L," also generates the clock signal PCK0 whose phase is adjusted to fall between the phases of the reference clocks. On the other hand, the phase interpolation circuit 21a, when the operation mode is "H," outputs one of the reference clocks as the clock signal PCK0. In other words, in this case, the phase interpolation circuit 21a operates as a selector. The clock signals PCK1-PCK5 are output from the phase interpolation circuits 21b-21f, respectively.

The clock signals PCK0-PCK5 have the same frequency and phase interval as those of the clock signals CK0-CK5. Of the clock signals PCK0-PCK5, the clock signal PCK0 has the most advanced phase, and the clock signal PCK5 has the most delayed phase.

The sampler circuit group 30 includes six sampler circuits 31a-31f (hereinafter abbreviated to sampler circuits 31 when it is not necessary to distinguish between them) corresponding to the phase interpolation circuits 21a-21f, respectively. The sampler circuits 31a-31f latch the data signal in synchronization with the clock signals PCK0-PCK5, respectively.

The phase control circuit 40 receives the operation mode signal and the outputs of the sampler circuits 31a-31f, and determines the phases of the clock signals PCK0-PCK5. The phase control circuit 40, when the operation mode is "L," performs phase determination on two bits of the data signal in parallel based on the outputs of the sampler circuits 31a, 31b, and 31c and the outputs of the sampler circuits 31d, 31e, and 31f. On the other hand, the phase control circuit 40, when the operation mode is "H," performs phase determination one bit of the data signal based on the output of the sampler circuits 31a, 31c, and 31e.

For example, the received output values of the three sampler circuits may be compared with each other to determine between which two of the sampler circuits the output value changes, whereby the phase is determined. The phase control circuit 40 designates two clock signals which are to be selected by the phase interpolation circuits 21a-21f, based on the result of the phase determination. Thereafter, the phase control circuit 40 notifies the phase interpolation circuits 21a-21f of the designated two clock signals, and when the operation mode is "L," instructs the phase interpolation circuits 21a-21f to adjust the phases of the clock signals PCK0-PCK5. As a result, the phases of the clock signals PCK0-PCK5 are controlled.

Figure 2B:
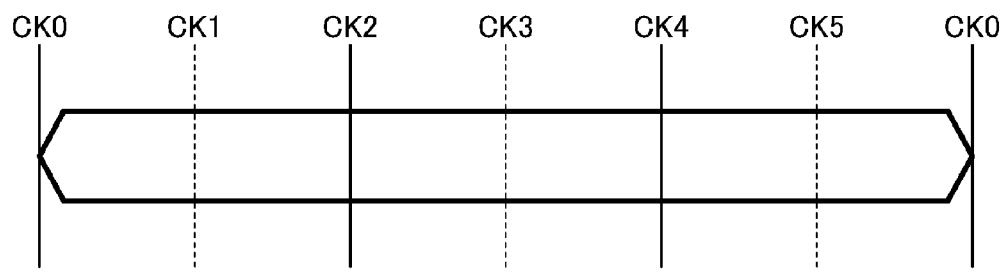

FIG. 2 is a timing chart showing a relationship between the data signal and the clock signals CK0-CK5. As described above FIG. 2A, when the operation mode is "L," the data signal is latched, two bits at a time, and the phase determination process is performed on the data signal in parallel, two bits at a time. Solid lines shown in FIG. 2A indicate the clock signals CK0-CK5. One of dashed lines between each solid line indicates a corresponding one of the clock signals PCK0-PCK5 whose phases have been adjusted. On the other hand, when the operation mode is "H," as shown in FIG. 2B, the data signal is latched, one bit at a time, and the phase determination process is performed on the data signal, one bit at a time. Solid lines and dashed lines shown in FIG. 2B indicate the clock signals CK0-CK5, which correspond to the clock signals PCK0-PCK5, respectively.

Figure 3:
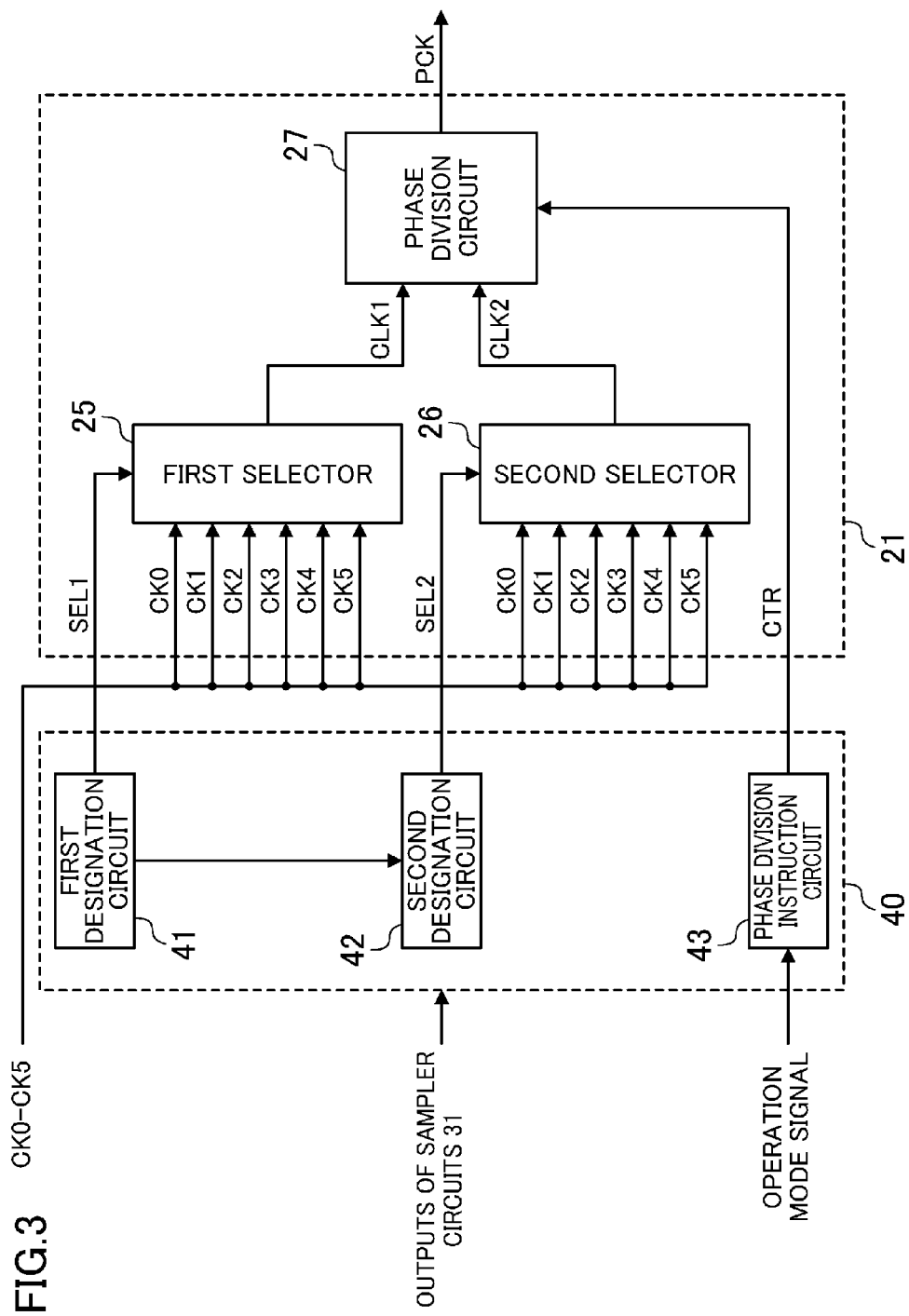
FIG. 3 is a diagram showing a configuration of a phase control circuit and a phase interpolation circuit of FIG. 1.

FIG. 3 is a diagram showing a configuration of the phase control circuit and the phase interpolation circuit of FIG. 1. The phase interpolation circuits 21a-21f have a similar configuration, and are hereinafter referred to as the phase interpolation circuits 21 without distinguishing between them.

The phase interpolation circuit 21 includes a first and a second selector 25 and 26 which receive the clock signals CK0-CK5, and a phase division circuit 27. The phase control circuit 40 includes a first and a second designation circuit 41 and 42, and a phase division instruction circuit 43.

The first selector 25 selects one of the clock signals CK0-CK5 based on the output of the first designation circuit 41. The selected clock signal is output as a first clock signal CLK1 to the phase division circuit 27.

The second selector 26 selects one of the clock signals CK0-CK5 based on the output of the second designation circuit 42. The selected clock signal is output as a second clock signal CLK2 to the phase division circuit 27.

The phase division circuit 27 receives the clock signals CLK1 and CLK2 as two reference clocks, and performs operation corresponding to the output of the phase division instruction circuit 43, to generate and output a clock signal PCK. Specifically, the phase division circuit 27, when the operation mode is "L," generates and outputs the clock signal PCK whose phase is adjusted to fall between the phases of the clock signals CLK1 and CLK2, and when the operation mode is "H," outputs one of the clock signals CLK1 and CLK2 as the clock signal PCK. Note that the clock signal PCK indicates one of the clock signals PCK0-PCK5.

For example, the first designation circuit 41 receives the outputs of the sampler circuits 31a-31f, performs the above phase determination, and based on the result of the phase determination, designates a clock signal which is to be selected by the first selector 25. Thereafter, the first designation circuit 41 notifies the first selector 25 of the designated clock signal using a signal SEL1. If the signal SEL1 has, for example, a format of "100000," the first selector 25 selectively outputs the clock signal CK0 as the clock signal CLK1.

The second designation circuit 42 designates a clock signal whose phase is separated by T/6 from the phase of the clock signal which is to be selected by the first selector 25, as a clock signal which is to be selected by the second selector 26, based on the output of the first designation circuit 41. Thereafter, the second designation circuit 42 notifies the second selector 26 of the designated clock signal using a signal SEL2. Note that the second designation circuit 42 may perform the phase determination based on the outputs of the sampler circuits 31. Thereafter, the second designation circuit 42 may output the signal SEL2 which has been obtained based on the result of the phase determination, to the second selector 26. If the signal SEL2 has, for example, a format of "010000," the second selector 26 selectively outputs the clock signal CK1 as the clock signal CLK2.

The phase division instruction circuit 43 receives the operation mode signal and the outputs of the sampler circuits 31, and performs the above phase determination. Based on the result of the phase determination, the phase division instruction circuit 43 instructs the phase division circuit 27 using a signal CTR to perform the phase adjustment when the operation mode is "L," and to directly select one of the clock signals CLK1 and CLK2 when the operation mode is "H."

Note that the order in which the clock signals CK0-CK5 are input to the first and second selectors 25 and 26 of the phase interpolation circuits 21*a*-21*f* may be determined in relation to the formats of the signals SEL1 and SEL2. When the phase interpolation circuit 21*a* is configured as shown in FIG. 3, the input order of the clock signals CK0-CK5 to the first and second selectors 25 and 26 of the phase interpolation circuits 21*b*-21*f* may be preferably shifted by one position from the configuration of FIG. 3 and then between each of the phase interpolation circuits 21*b*-21*f*. Specifically, the clock signals are input to the first and second selectors 25 and 26 of the phase interpolation circuit 21*b* in the following order: CK1, CK2, CK5, . . . , and CK0. The clock signals are input to the first and second selectors 25 and 26 of the phase interpolation circuit 21*c* in the following order: CK2, CK3, . . . , CK5, CK0, and CK1. Similarly, the input order may be successively shifted by one position for the phase interpolation circuits 21*d*-21*f*. As a result, the signals SEL1 and SEL2 having the same values can be used for all the phase interpolation circuits 21*a*-21*f*. Also, the clock signals PCK0-PCK5 have equal phase intervals, and therefore, the sampler circuits 31 can accurately latch the data signal. As a result, the phase control circuit 40 can perform a more accurate phase control.

Figure 4:
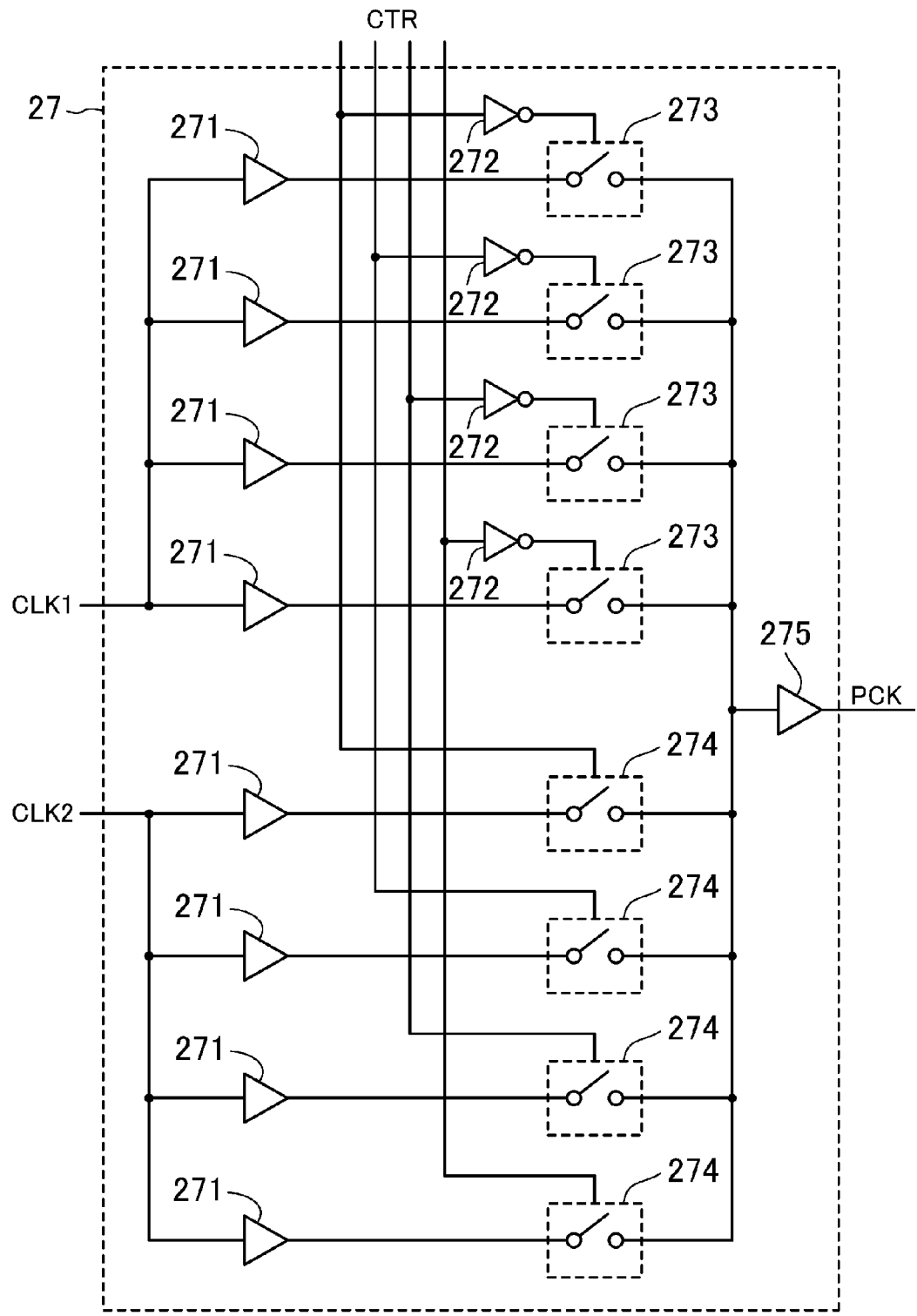
FIG. 4 is a circuit diagram showing an example configuration of a phase division circuit shown in FIG. 3.

FIG. 4 is a circuit diagram showing an example configuration of a phase division circuit. The phase division circuit 27 combines the clock signals CLK1 and CLK2 together at a ratio corresponding to the value of the signal CTR, and outputs the combined signal. Specifically, the phase division circuit 27 includes eight input buffers 271, four inverters 272, four switches 273, four other switches 274, and one output buffer 275. Note that the phase division circuit 27 of FIG. 4 has an example configuration where the phase resolution is "4."

The input buffers 271 extend the time it takes for the input clock signals CLK1 and CLK2 to transition logically, and output the resultant clock signals CLK1 and CLK2.

The inverters 272 each invert a corresponding one of the bits of the signal CTR, which is, for example, a 4-bit thermometer code, and output the inverted bit signal to the corresponding switch 273.

The switch 273 is turned on to directly output an input from the input buffer 271 when the output of the inverter 272 is "1," and is turned off to shut out an input from the input buffer 271 when the output of the inverter 272 is "0."

The switch 274 is turned on to directly output an input from the input buffer 271 when the corresponding bit of the signal CTR is "1," and is turned off to shut out an input from the input buffer 271 when the corresponding bit of the signal CTR is "0." The output buffer 275 outputs the sum of the outputs of the switches 273 and 274.

Thus, the phase division circuit 27 having a phase resolution of "4" generates the clock signals PCK indicated by the dashed lines in FIG. 2A.

Next, phase control operation of the timing recovery circuit of this embodiment will be described with reference to FIGS. 3, 4, and 5A and 5B. FIGS. 5A and 5B are diagrams showing waveforms of input signals (FIG. 5A) and output signals (FIG. 5B) of the output buffer when the operation mode is "L."

As an initial state, it is assumed that the first designation circuit 41 outputs the signal SEL1 having a value which causes the first selector 25 to select the clock signal CK0, and the second designation circuit 42 outputs the signal SEL2 having a value which causes the second selector 26 to select the clock signal CK1.

As a result, the first selector 25 outputs the clock signal CK0 as the clock signal CLK1, and the second selector 26 outputs the clock signal CK1 as the clock signal CLK2. The clock signals CLK1 and CLK2 are reference clocks indicated by reference characters 501 and 505, respectively, of FIG. 5A. In FIGS. 5A and 5B, input signals indicated by reference characters 501, 502, . . . , and 505 correspond to output signals indicated by reference characters 511, 512, . . . , and 515, respectively.

Also, it is assumed that, in the initial state, the phase division instruction circuit 43 outputs the signal CTR whose initial value is, for example, "0000." As a result, all the switches 273 are on and all the switches 274 are off, and therefore, the output of the output buffer 275, i.e., the clock signal PCK, has a waveform indicated by the reference character 511.

Firstly, a case where the operation mode is "L" and a control which delays the phase from the initial state will be described. In this case, the clock generation circuit 10 outputs the clock signals CK0-CK5 which have a period of T (=2P) and a phase interval of T/6.

The phase division instruction circuit 43 performs the phase determination based on the outputs of the sampler circuits 31, and when determining based on the result of the phase determination that it is necessary to delay the phase of the clock signal PCK, sets the value of the signal CTR to "0001." As a result, one of the switches 273 is turned off and one of the switches 274 is turned on. In other words, the clock signals CLK1 and CLK2 are combined at a ratio of 3:1, and therefore, the input signal to the output buffer 275 has a waveform indicated by the reference character 502, and the output signal of the output buffer 275 has a waveform indicated by the reference character 512. In other words, the clock signal PCK whose phase is delayed by T/24 from the initial state is generated.

Note that the reference characters 503 and 513 of FIGS. 5A and 5B indicate waveforms which are obtained when two of the bits of the signal CTR are "1," and the reference characters 504 and 514 indicate waveforms which are obtained when three of the bits of the signal CTR are "1." The reference characters 505 and 515 indicate waveforms which are obtained when all the four bits of the signal CTR are "1."

The phase division instruction circuit 43, when determining that it is necessary to further delay the phase of the clock signal PCK, successively changes the value of the signal CTR to "0011" and then to "0111". As a result, the waveform of the clock signal PCK transitions to those indicated by the reference characters 513 and 514 of FIGS. 5A and 5B. When a control is performed to further delay the clock signal PCK which has a waveform indicated by the reference character 514, the phase division instruction circuit 43 changes the value of the signal CTR back to "0000." Thereafter, the first and second designation circuits 41 and 42 change the values of the signals SEL1 and SEL2, and instruct the first and second selectors 25 and 26 to select a clock signal having a delayed phase. Specifically, the first designation circuit 41 changes the value of the signal SEL1 so that the first selector 25 selects the clock signal CK1, and the second designation circuit 42 changes the value of the signal SEL2 so that the second selector 26 selects the clock signal CK2. As a result, the clock signal CLK1 becomes the clock signal CK1, and the clock signal CLK2 becomes the clock signal CK2.

As a result, while the clock signal PCK has a waveform indicated by the reference character 511 of FIG. 5B, the phases of waveforms (reference clocks) indicated by the reference characters 501 and 505 are each delayed by T/6 from the initial state. Therefore, the phase of the waveform of the reference character 511, i.e., the clock signal PCK, is delayed by T/24 from the state which occurs immediately before the value of the signal CTR returns to "0000."

Thus, when the value of the signal CTR exceeds the upper limit value "0111," the reference clock is changed to a clock signal whose phase is further delayed, whereby the phase of the clock signal PCK can be infinitely delayed.

Here, when the value of the signal CTR and the values of the signals SEL1 and SEL2 are simultaneously changed, a glitch is likely to occur in the clock signal PCK due to the delay of these signals etc. In order to reduce or avoid this, the value of the signal CTR may be first changed from "0111" to "1111," and the value of the signal SEL1 may be next changed from a value indicating selection of the clock signal CK0 to a value indicating selection of the clock signal CK1. Thereafter, the value of the signal CTR may be changed from "1111" to "0000," and finally, the value of the signal SEL2 may be changed from a value indicating selection of the clock signal CK1 to a value indicating selection of the clock signal CK2.

Next, a case where a control is performed to advance the phase from the initial state will be described. The phase division instruction circuit 43 first changes the value of the signal CTR from "0000" to "0111," and at the same time, the first and second designation circuits 41 and 42 change the values of the signals SEL1 and SEL2 to instruct the first and second selectors 25 and 26 to select a clock signal having a further advanced phase. Specifically, the first designation circuit 41 changes the value of the signal SEL1 so that the first selector 25 selects clock signal CK5, and the second designation circuit 42 changes the value of the signal SEL2 so that the second selector 26 selects the clock signal CK0. As a result, the phase of the clock signal PCK is advanced ahead of the phase of the waveform of the reference character 511 by T/24. The phase may be further advanced by successively changing the value of the signal CTR to "0011," then to "0001," and then to "0000." When the value of the signal CTR is lower than the lower limit value "0000," the phase of the clock signal PCK can be infinitely advanced by changing the reference clock to a clock signal having a further advanced phase.

Similar to the case where the phase is delayed, when the value of the signal CTR and the values of the signals SEL1 and SEL2 are simultaneously changed, a glitch is likely to occur in the clock signal PCK. In order to reduce or avoid this, the value of the signal SEL2 may be first changed to a value indicating selection of the clock signal CK0. Next, the value of the signal CTR may be changed from "0000" to "0111," and thereafter, the value of the signal SEL1 may be changed to a value indicating selection of the clock signal CK5.

As described above, the phase interpolation circuit 21 can shift the phase of the clock signal PCK forward and backward, by T/24 at a time, based on the result of the phase determination.

Next, a case where the operation mode is "H" will be described. The clock generation circuit 10 outputs the clock signals CK0-CK5 which have a period of T (=P) and a phase interval of T/6. Note that it is assumed that the initial state which occurs when the operation mode is "H" is the same as that which occurs when the operation mode is "L."

When the operation mode is "H," the phase division instruction circuit 43 outputs the signal CTR which has a fixed value of, for example, "0000." The first designation circuit 41, when determining based on the result of the phase determination that it is necessary to delay the phase of the clock signal PCK, changes the value of the signal SEL1 to instruct the first selector 25 to select the clock signal CK1. When the phase of the clock signal PCK is further delayed, the value of the signal SEL1 is successively changed and the first selector 25 is instructed to successively select the clock signals CK2, CK3, . . . . As a result, the phase of the clock signal PCK can be delayed by T/6 at a time.

On the other hand, when it is necessary to advance the phase of the clock signal PCK, the first designation circuit 41 instructs the first selector 25 to select the clock signal CK5. When the phase of the clock signal PCK is further advanced, the first designation circuit 41 instructs the first selector 25 to successively select the clock signals CK4 and CK3. As a result, the phase of the clock signal PCK can be advanced by T/6 at a time.

As described above, when the operation mode is "H," the signal CTR has a fixed value of "0000," and therefore, all the switches 274 of FIG. 4 are off. In other words, the second designation circuit 42 does not need to control the second selector 26, and therefore, the influence of the clock signal CLK2 on the clock signal PCK can be ignored.

Note that the second designation circuit 42 may perform the phase determination, and based on the result of the phase determination, instruct the second selector 26 to select the clock signals CK0-CK5. In this case, the phase division instruction circuit 43 may invariably output the signal CTR having a value of "1111." As a result, the first designation circuit 41 does not need to control the first selector 25.

As described above, according to this embodiment, if the frequency of the clock signals CK0-CK5 is within the operating range of the phase division circuit 27, the timing recovery circuit is caused to operate in the operation mode of "L," and otherwise, the timing recovery circuit is caused to operate in the operation mode of "H." As a result, timing recovery operation can be achieved irrespective of the operating range of the phase division circuit 27. Also, when the transmission rate is low, the amount of a change in the phase of the clock signal PCK which occurs when the phase control circuit 40 performs a phase control once on the phase interpolation circuit 21 is T/6. Therefore, the phase tracking performance can be maintained high.

Here, as a comparative example, operation which is performed when the transmission rate is low and a phase control is performed in the operation mode of "L" will be described. In this case, the phase determination process is performed on a 2-bit data signal in parallel, and therefore, the frequency of the clock signals CK0-CK5 is 1/T (=2P).

FIGS. 6A and 6B are diagrams showing waveforms of input and output signals of the output buffer which are obtained when the transmission rate is low. FIGS. 6A and 6B show waveforms of the input signals (FIG. 6A) and the output signals (FIG. 6B).

When the frequency of the clock signal CLK1 (reference character 601) and the clock signal CLK2 (reference character 605), which are reference clocks, is low, as shown in FIG. 6A the clock signals indicated by the reference characters 601 and 605 rise in a time which is sufficiently short compared to the phase difference between the clock signals.

In FIG. 4, if it is assumed that only one of the bits of the signal CTR is "1," the clock signals CLK1 and CLK2 are combined together at a ratio of 3:1. As a result, the input signal to the output buffer 275 has a waveform indicated by a reference character 602 of FIG. 6A, and the output signal from the output buffer 275 has a waveform indicated by a reference character 612 of FIG. 6B. The waveforms of the input and output signals of the output buffer 275 vary depending on the combination ratio of the clock signals CLK1 and CLK2, as indicated by reference characters 601-605 and reference characters 611-615.

This is because when the clock signal CLK1 is high, the effect of the combination of the clock signals CLK1 and CLK2 is effective only in the amplitude direction, and therefore, a timing at which the input signal after the combination (e.g., a waveform indicated by the reference character 602) reaches a threshold voltage Vt of the output buffer 275 becomes closer to the phase of the clock signal CLK1 than what is expected.

Thus, when the frequency of the clock signals CLK1 and CLK2 is low, the effect of the combination of these signals does not emerge in the time axis direction, and therefore, the phase interval of the clock signal PCK which is the output of the output buffer 275 becomes non-uniform.

In contrast to this, in this embodiment, when the transmission rate is low, i.e., when the operation mode is "H," as described above the phase determination process is performed on a data signal, one bit at a time, and the reference clocks are not combined. Therefore, the amount of a change in the phase of the clock signal PCK becomes uniform.

—Variations—

FIG. 7 is a diagram showing a configuration of a variation of the phase control circuit and the phase interpolation circuit of FIG. 3. The same reference characters in FIGS. 3 and 7 indicate the same components.

The first selector 25 receives three of the six clock signals CK0-CK5 which are the clock signals CK0, CK2, and CK4, whose phases are separated by T/3 from each other. The first selector 25 selectively outputs one of the clock signals CK0, CK2, and CK4 as the clock signal CLK1 based on the output of the first designation circuit 41.

The second selector 26 receives three of the six clock signals CK0-CK5 which are the clock signals CK1, CK3, and CK5, whose phases are separated by T/6 from the phases of the clock signals input to the first selector 25. The second selector 26 selectively outputs one of the clock signals CK1, CK3, and CK5 as the clock signal CLK2 based on the output of the second designation circuit 42.

The second designation circuit 42 performs the phase determination on the received outputs of the sampler circuits 31, and based on the result of the phase determination, designates, as a clock signal which is to be selected by the second selector 26, a clock signal whose phase is separated by T/6 from that of the clock signal selected by the first selector 25. Thereafter, the second designation circuit 42 notifies the second selector 26 of the designated clock signal using the signal SEL2.

Note that when the phase interpolation circuit 21a is configured as shown in FIG. 7, the input order of the clock signals CK0-CK5 to the first and second selectors 25 and 26 of the phase interpolation circuits 21b-21f may be preferably shifted by one position from the configuration of FIG. 7 and then between each of the phase interpolation circuits 21b-21f. Specifically, the clock signals are input to the first selector 25 of the phase interpolation circuit 21b in the following order: CK1, CK3, and CK5. The clock signals are input to the second selector 26 of the phase interpolation circuit 21b in the following order: CK2, CK4, and CK0. The clock signals are input to the first selector 25 of the phase interpolation circuit 21c in the following order: CK2, CK4, and CK0. The clock signals are input to the second selector 26 of the phase interpolation circuit 21c in the following order: CK3, CK5, and CK1. Similarly, the input order may be successively shifted by one position for the phase interpolation circuits 21d-21f.

In this variation, the signals SEL1 and SEL2 indicate the ordinal position of one of the input clock signals which the first and second selectors 25 and 26, respectively, are to select. The signals SEL1 and SEL2 have, for example, the value of one of integers "0" to Therefore, when the value of the signal SEL1 is "0" and the value of the signal SEL2 is "2," the first selector 25 selects and outputs clock signal CK0 as the clock signal CLK1 and the second selector 26 selects and outputs the clock signal CK5 as the clock signal CLK2 in the phase interpolation circuit 21a. The phase division circuit 27, when the operation mode is "L," generates and outputs the clock signal PCK0 whose phase is adjusted to fall between the phases of the clock signals CK5 and CK0. The phase division circuit 27, when operation mode is "H," outputs one of the clock signals CK5 and CK0 as the clock signal PCK0.

In the phase interpolation circuit 21b, the first and second selectors 25 and 26 select the clock signals CK1 and CK0 as reference clocks. The phase division circuit 27, when the operation mode is "L," generates and outputs the clock signal PCK1 whose phase is adjusted to fall between the phases of the clock signals CK1 and CK0. On the other hand, the phase division circuit 27, when the operation mode is "H," outputs one of the clock signals CK1 and CK0 as the clock signal PCK1. Similarly, the phase interpolation circuits 21c-21f output the clock signals PCK2-PCK5, respectively. The signal CTR having the same value is input to all of the phase interpolation circuits 21a-21f, and therefore, the phase interval between each of the clock signals PCK0-PCK5 is T/6.

Next, phase control operation of the timing recovery circuit of this variation will be described with reference to FIGS. 4, 5A and 5B, and 7. Note that it is assumed that the phase division circuit 27 has the same configuration as that of FIG. 4 and the same initial state as that described above.

The phase division instruction circuit 43, when determining based on the outputs of the sampler circuits 31 that it is necessary to delay the phase of the clock signal PCK, sets the value of the signal CTR to "0001." As a result, the clock signals CLK1 and CLK2 are combined together at a ratio of 3:1, and therefore, the clock signal PCK has a waveform indicated by the reference character 512.

The phase division instruction circuit 43, when determining that it is necessary to further delay the phase of the clock signal PCK, successively changes the value of the signal CTR to "0011," then to "0111," and then to "1111." As a result, the waveform of the clock signal PCK successively transitions to those indicated by the reference characters 513, 514, and 515. When a control is performed to further delay the phase from that state, the first designation circuit 41 changes the value of the signal SEL1 so that the first selector 25 selects the clock signal CK2. As a result, the clock signal CLK1 becomes the clock signal CK2, and the clock signal CLK2 becomes the clock signal CK1. Because the phase of the clock signal CLK1 is delayed from that of the clock signal CLK2, the phase division instruction circuit 43 successively decreases the value of the signal CTR. Specifically, the phase division instruction circuit 43 causes the value of the signal CTR to successively transition to "1111," "0111," "0011," "0001," and "0000."

When the value of the signal CTR is "0000" and it is necessary to further delay the phase of the clock signal PCK, the second designation circuit 42 changes the value of the signal SEL2 so that the second selector 26 selects the clock signal CK3. In this case, the clock signal CLK1 is the clock signal CK2, the clock signal CLK2 is the clock signal CK3, and the phase of the clock signal CLK2 is delayed from that of the clock signal CLK1, and therefore, the phase division instruction circuit 43 successively increases the value of the signal CTR. Specifically, the phase division instruction circuit 43 causes the value of the signal CTR to successively transition to "0000," "0001," "0011," "0111," and "1111."

Next, a case where a control is performed to advance the phase from the initial state will be described. Initially, the second designation circuit 42 changes the value of the signal SEL2 so that the second selector 26 selects the clock signal CK5. As a result, the clock signal CLK2 is changed from the clock signal CK1 to the clock signal CK5. Thereafter, the phase division instruction circuit 43 successively changes the value of the signal CTR to "0000," "0001," "0011," "0111," and "1111." As a result, the phase of the clock signal PCK can be advanced.

When the value of the signal CTR is "1111" and it is necessary to further advance the phase, the first designation circuit 41 changes the value of the signal SEL1 so that the first selector 25 selects the clock signal CK4. As a result, the clock signal CLK1 is changed from the clock signal CK0 to the clock signal CK4. Thereafter, the phase of the clock signal PCK can be further advanced by the phase division instruction circuit 43 successively changing the value of the signal CTR to "1111," "0111," "0011," "0001," and "0000."

Thus, if the value of the signal CTR is "0000," the value of the signal SEL2 is changed, and if the value of the signal CTR is "1111," the value of the signal SEL1 is changed, whereby the phase of the clock signal PCK can be infinitely delayed and advanced.

Next, operation which is performed when the operation mode is "H" will be described. The clock generation circuit 10 outputs the clock CK0-CK5 which have a period of T (=P) and a phase interval of T/6. Note that the initial state is similar to that which occurs when the operation mode is "L."

When the operation mode is "H," the phase division instruction circuit 43 outputs the signal CTR having a value of "0000" or "1111."

When a control is performed to delay the phase from the initial state, the phase division instruction circuit 43 changes the value of the signal CTR from "0000" to "1111." As a result, the clock signal PCK has a waveform indicated by the reference character 515. Specifically, the phase of the clock signal PCK is delayed by T/6. When the phase is further delayed, the first designation circuit 41 changes the value of the signal SEL1 so that the first selector 25 selects the clock signal CK2. Thereafter, the phase division instruction circuit 43 changes the value of the signal CTR from "1111" to "0000." As a result, the phase of the clock signal PCK can be further delayed by T/6.

Conversely, when a control is performed to advance the phase from the initial state, the second designation circuit 42 changes the value of the signal SEL2 so that the second selector 26 selects the clock signal CK5. Thereafter, the phase division instruction circuit 43 changes the value of the signal CTR from "0000" to "1111." When the phase is further advanced, the first designation circuit 41 changes the value of the signal SEL1 so that the first selector 25 selects the clock signal CK4. Thereafter, the phase division instruction circuit 43 may change the value of the signal CTR from "1111" to "0000."

Thus, when the value of the signal CTR is "0000," the value of the signal SEL2 is changed, and when the value of the signal CTR is "1111," the value of the signal SEL1 is changed, whereby the phase of the clock signal PCK can be infinitely delayed and advanced.

As described above, even when the phase interpolation circuit 21 and the phase control circuit 40 are configured as shown in FIG. 7, advantages similar to those of the configuration of FIG. 3 can be obtained. Moreover, the number of clock signals input to the first and second selectors 25 and 26 can be reduced compared to the configuration of FIG. 3, and therefore, the circuit scale of the first and second selectors 25 and 26 can be reduced.

Note that, in FIG. 4, the phase division circuit 27 is assumed to have a phase resolution of "4." Therefore, when the operation mode is "L," the amount of a change in the phase of the clock signal PCK which is caused when the phase control circuit 40 performs a phase control once on the phase interpolation circuit 21 is P/12 (=T/24). On the other hand, when the operation mode is "H," the amount of a change in the phase of the clock signal PCK which is caused when the phase control is performed once is equal to the phase interval of the clock signals CK0-CK5, i.e., P/6 (=T/6). Thus, the phase tracking performance differs between the operation modes. In order to provide the same phase tracking performance in the operation modes, the phase resolution of the phase division circuit 27 or the number of clock signals output from the clock generation circuit 10 may be adjusted. Therefore, the phase resolution of the phase division circuit 27 and the number of clock signals generated by the clock generation circuit 10 are not limited to those described above.

In the foregoing, when the operation mode is "L," the data signal is processed in parallel, two bits at a time, and when the operation mode is "H," the data signal is processed sequentially, one bit at a time. Alternatively, when the operation mode is "L," the data signal may be processed in parallel, m bits at a time (m is an integer of three or more). Alternatively, three or more operation modes may be provided, and the number of bits of the data signal which are processed in parallel may be changed, depending on the transmission rate.

For example, in the configuration of FIG. 1, it is assumed that there are switchable operation modes "L1" and "L2" instead of the operation mode "L," and when the operation mode is "L1," 2-bit parallel processing is performed, and when the operation mode is "L2," 3-bit parallel processing is performed. When the operation mode is "L1," the above control is performed, i.e., a phase control is performed so that the amount of a change in the phase becomes T/24, i.e., P/12, where the oversampling rate is "3." On the other hand, when the operation mode is "L2," then if the oversampling rate is set to "2," 3-bit parallel processing can be achieved. In this case, the amount of a change in the phase is P/8. In order to obtain the same amount of a change in the phase between when the operation mode is "L1" and when the operation mode is "L2," the phase resolution in the operation mode "L2" may be set to "6" instead of "4."

In order to provide a variable phase resolution, for example, in FIG. 4, a large number of the components other than the output buffer 275 are previously provided, and the number of components which are used, of those components, may be changed, depending on the operation mode.

The number of bits which are processed in parallel without changing the oversampling rate may, of course, be variable. For example, when it is assumed that 2-bit parallel processing is performed when the operation mode is "L1" and 4-bit parallel processing is performed when the operation mode is "L2", and the oversampling rate is "3," 12 phase interpolation circuits and 12 sampler circuits may be provided. When the operation mode is "L2," all of the 1st to 11th phase interpolation circuits and sampler circuits are used, and when the operation mode is "L1," only the 0th, 2nd, 4th, 6th, 8th, and 10th phase interpolation circuits and sampler circuits are used. When the operation mode is "H," only the 0th, 4th, and 8th phase interpolation circuits and sampler circuits are used. Therefore, while the oversampling rate is kept at "3," the number of bits which are processed in parallel can be changed between "1," "2," and "4," depending on the operation mode.

Figure 8:
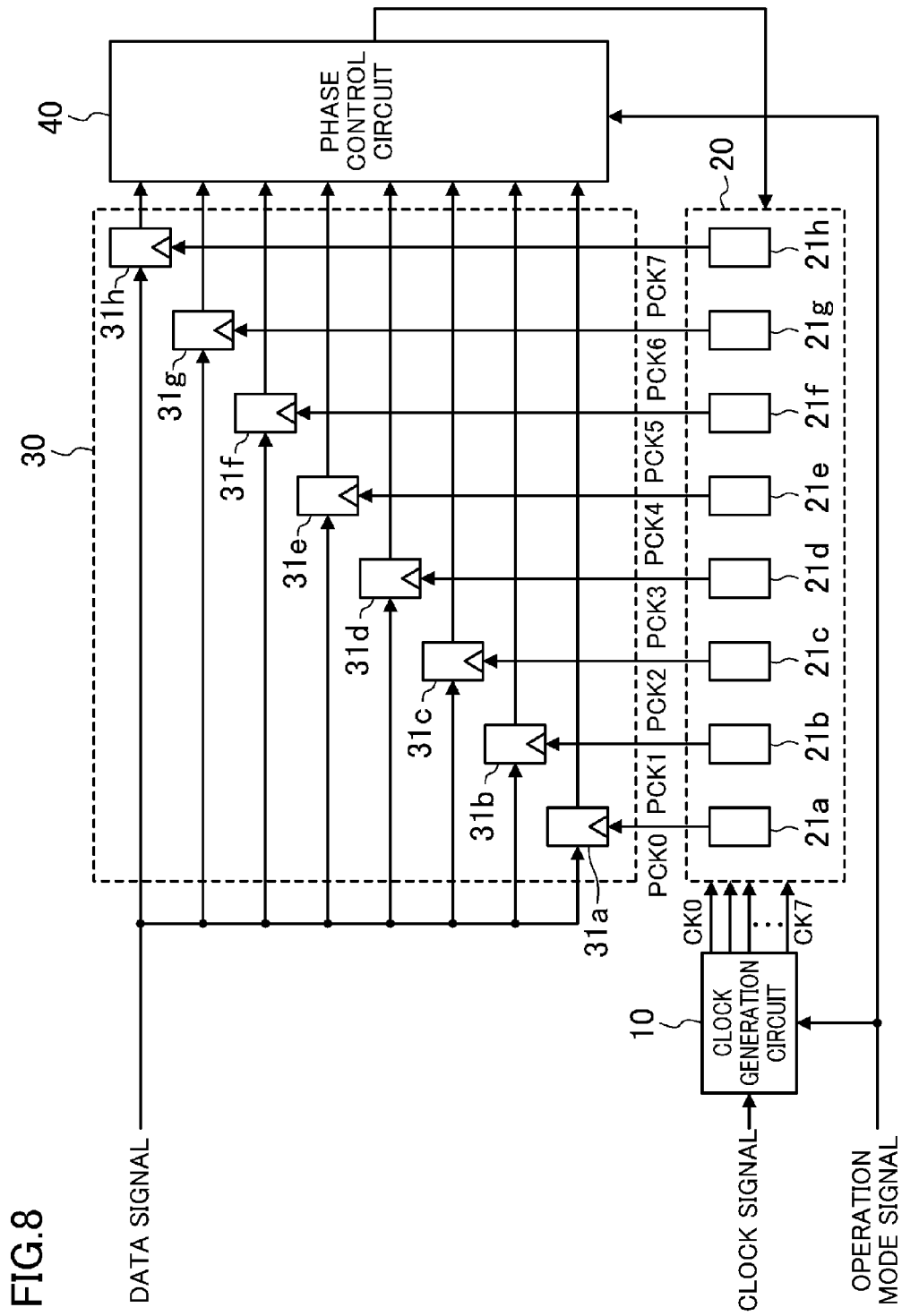
FIG. 8 is a diagram showing another configuration of the timing recovery circuit of the first embodiment.

When, as shown in FIG. 8, eight phase interpolation circuits 21a-21h and eight sampler circuits 31a-31h are provided, the oversampling rate may be "2," and the phase determination process may be performed on the data signal in parallel, four bits at a time, the operation mode is "L." Alternatively, the oversampling rate may be "4," and the phase determination process may be performed on the data signal in parallel, two bits at a time. Note that the clock generation circuit 10 generates and outputs clock signals CK0-CK7.

Alternatively, k phase interpolation circuits 21 and k sampler circuits 31 (k is an integer of four or more) may be provided. Of these circuits, the same numbers of phase interpolation circuits 21 and sampler circuits 31 as (the oversampling rate)×(the number of bits which are processed in parallel when the operation mode is "L") may be used in the timing recovery operation.

Note that the numbers of the phase interpolation circuits 21 and the sampler circuits 31 are not limited to those described above. For example, with a configuration shown in FIG. 9, the oversampling rate is "3," and the data signal can be processed in parallel, two bits at a time, when the operation mode is "L."

Figure 9:
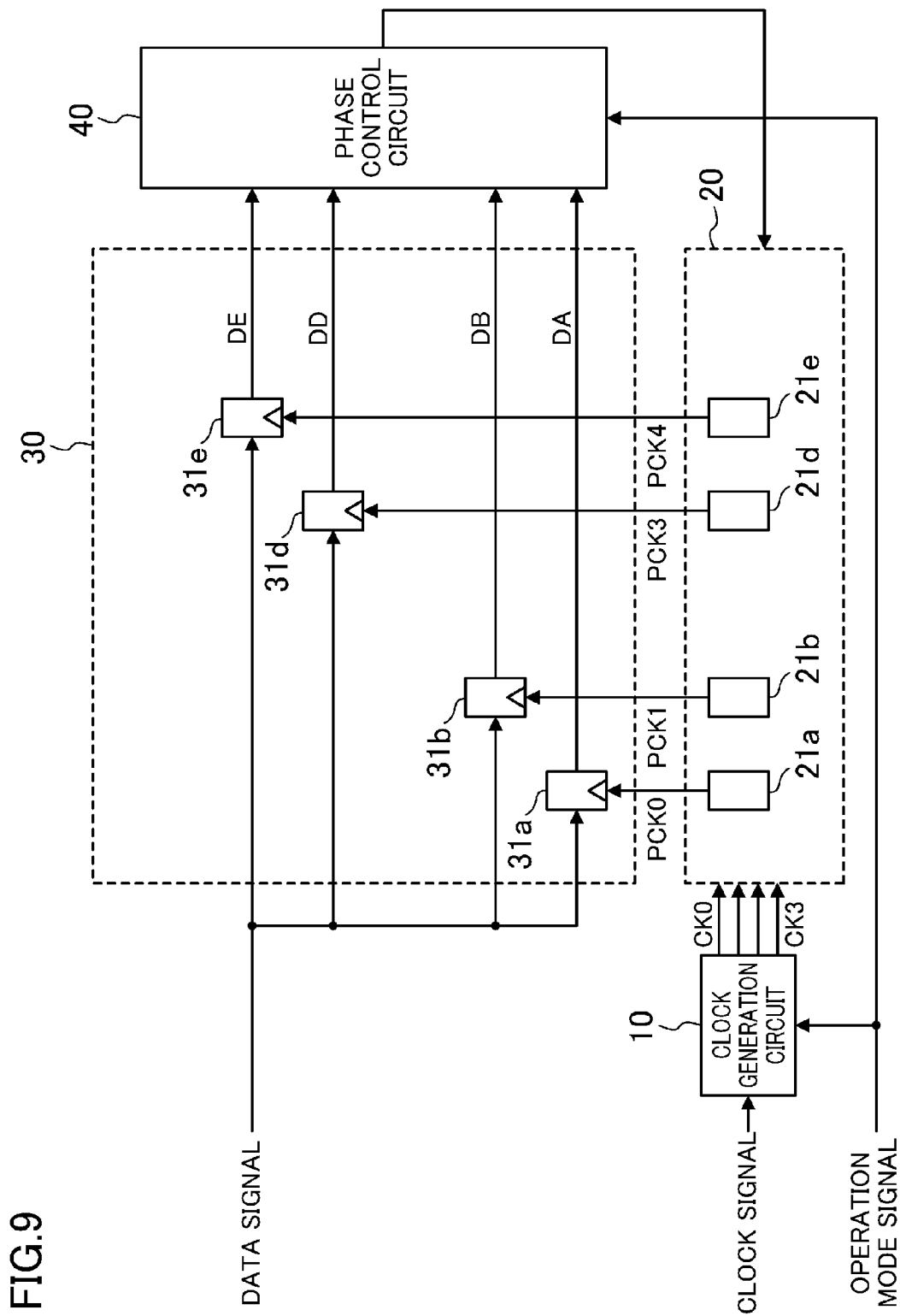
FIG. 9 is a diagram showing still another configuration of the timing recovery circuit of the first embodiment.

In the timing recovery circuit of FIG. 9, four phase interpolation circuits 21 and four sampler circuits 31 are provided. Note that the clock generation circuit 10 generates and outputs clock signals CK0-CK3. In FIG. 9, reference characters DA, DB, DD, and DE indicate the output signals of the sampler circuits 31a, 31b, 31d, and 31e, respectively. In this timing recovery circuit, the phase control circuit 40, when operation mode is "L," performs the phase determination, two bits at a time, using the signals DA, DB, and DD and the signals DD, DE, and DA', and when the operation mode is "H," performs the phase determination, one bit at a time, using the signals DA, DD, and DA'. Here, the signal DA' is a signal which is latched by the sampler circuit 31a one cycle after the signal DA.

The timing recovery circuit may be thus configured. Note that, in the timing recovery circuit of FIG. 9, the clock signals PCK0, PCK1, PCK3, and PCK4 which are the outputs of the phase interpolation circuits 21a, 21b, 21d, and 21e preferably have equal phase intervals.

Second Embodiment

Figure 10:
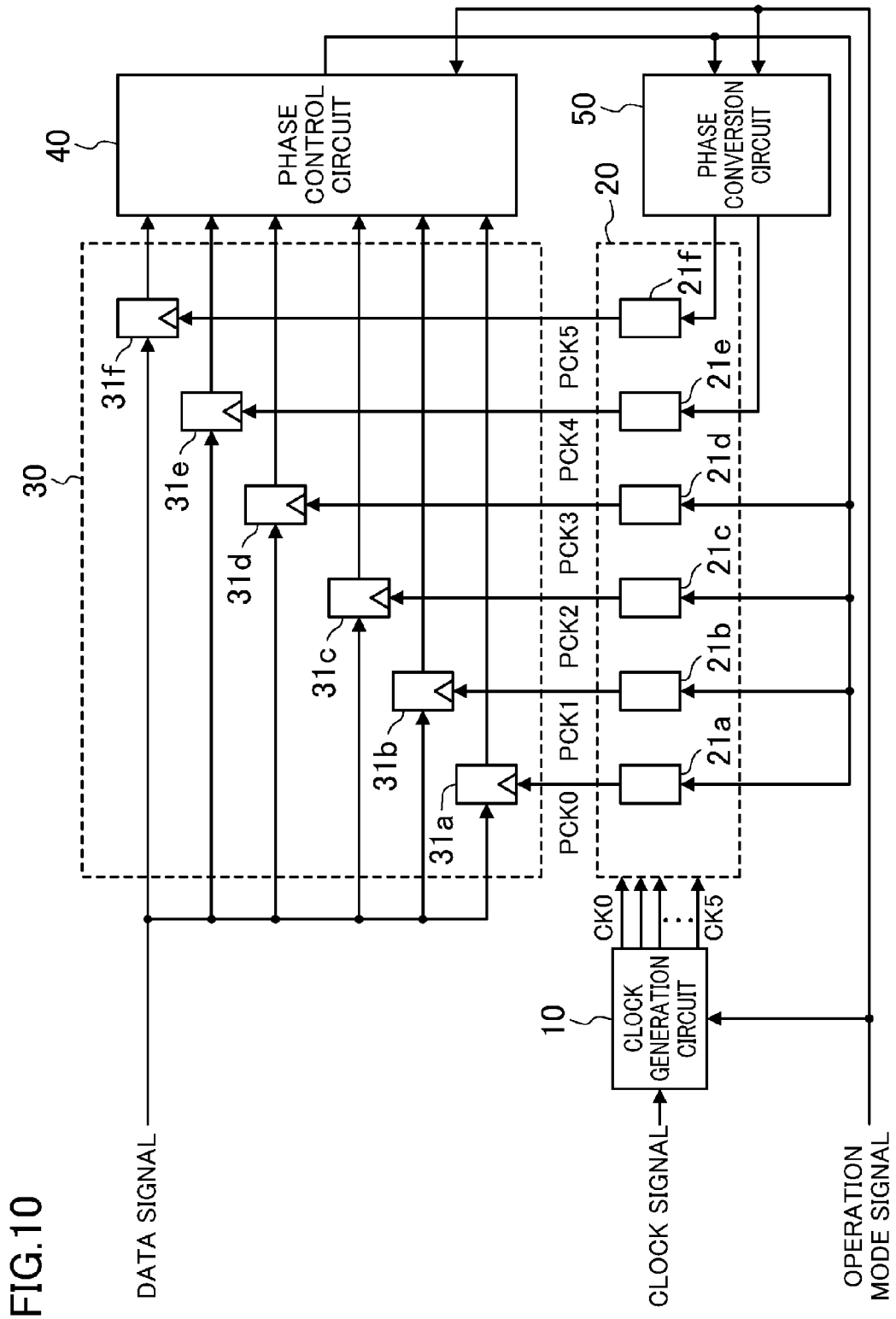
FIG. 10 is a diagram showing a configuration of a timing recovery circuit according to a second embodiment.

FIG. 10 is a diagram showing a configuration of a timing recovery circuit according to a second embodiment. The same reference characters in FIGS. 1 and 10 indicate the same components. Note that the phase interpolation circuits 21a-21f and the phase control circuit 40 of FIG. 10 have a configuration similar to that of FIG. 3 or 7.

In the first embodiment, when the operation mode is "L," the phase determination is performed based on the outputs of the sampler circuits 31a, 31b, and 31c and the outputs of the sampler circuits 31d, 31e, and 31f, and when the operation mode is "H," the phase determination is performed based on the outputs of the sampler circuits 31a, 31c, and 31e.

Therefore, the phase control circuit 40 needs to have a function of determining the output of which sampler circuit to use in the phase determination process, depending on the operation mode.

However, when there is a constraint on the design of the phase control circuit 40, such as that the above function cannot be implemented in the phase control circuit 40, etc., the phase determination process may need to be performed using the outputs of the same sampler circuits in both of the operation modes. To achieve this, in this embodiment, a phase conversion circuit 50 is provided.

The phase control circuit 40, when the operation mode is "L," performs operation similar to that of the first embodiment. On the other hand, when the operation mode is "H," the phase control circuit 40 performs the phase determination based on the outputs of the sampler circuits 31d, 31e, and 31f, and instructs the phase interpolation circuits 21d-21f to select two clock signals whose phases are separated by T/6 from each other.

The phase conversion circuit 50, when the operation mode is "L," directly outputs an instruction which is sent from the phase control circuit 40 to the phase interpolation circuits 21e and 21f. In other words, when the operation mode is "L," the timing recovery circuit of this embodiment performs operation similar to that of the first embodiment. On the other hand, when the operation mode is "H," the phase conversion circuit 50 instructs the phase interpolation circuits 21e and 21f to output the clock signals PCK4 and PCK5 whose phases are different from when those are output according to the instruction from the phase control circuit 40.

Unless the phase conversion circuit 50 is provided, as described above the phases of the clock signals PCK0-PCK5 which are output from the phase interpolation circuits 21a-21f according to the instruction from the phase control circuit 40 are separated by T/6 from each other. In contrast to this, the phase conversion circuit 50 instructs the phase interpolation circuits 21e and 21f to delay the phases of the clock signals PCK4 and PCK5 by T/6 and T/3, respectively, with reference to the phases of the clock signals PCK4 and PCK5 which are output according to the instruction from the phase control circuit 40. In other words, the phase conversion circuit 50 instructs the phase interpolation circuits 21d-21f to output the clock signals PCK3-PCK5 whose phases are separated by T/3 from each other.

As a result, when the operation mode is "H," the phase interpolation circuits 21a-21d output the clock signals PCK0-PCK3 whose phases are separated by T/6 from each other, and the phase interpolation circuits 21d-21f output the clock signals PCK3-PCK5 whose phases are separated by T/3 from each other. Therefore, the sampler circuits 31d-31f receive the data signal in synchronization with the clock signals PCK3-PCK5, respectively, whereby the phase control circuit 40 can obtain 3-bit information which is produced by oversampling one bit of the data signal by a factor of three. The phase control circuit 40 can also perform the phase determination process using the 3-bit information.

A more specific example of the operation of the phase conversion circuit 50 in the case where the phase interpolation circuit 21 has the configuration of FIG. 7 will now be described. As described above, the clock signals CK0-CK5 are input to the first and second selectors 25 and 26 of the phase interpolation circuits 21a-21f, where the cardinal positions of the clock signals input to the first and second selectors 25 and 26 are separated by one from each other. Specifically, the clock signals are input to the first selector 25 of the phase interpolation circuit 21d in the following order: CK3, CK5, and CK1. The clock signals are input to the second selector 26 of the phase interpolation circuit 21d in the following order: CK4, CK0, and CK2.

The clock signals are input to the first selector 25 of the phase interpolation circuit 21e in the following order: CK4, CK0, and CK2. The clock signals are input to the second selector 26 of the phase interpolation circuit 21e in the following order: CK5, CK1, and CK3.

The clock signals are input to the first selector 25 of the phase interpolation circuit 21f in the following order: CK5, CK1, and CK3. The clock signals are input to the second selector 26 of the phase interpolation circuit 21f in the following order: CK0, CK2, and CK4.

Here, it is assumed that the values of the signals SEL1 and SEL2 which are the outputs of the first and second designation circuits 41 and 42 of FIG. 7 are each one of "100," "010," and "001," which represent integer values of "0," "1," and "2," respectively.

When the operation mode is "H," the phase conversion circuit 50 generates signals SEL1' and SEL2' and a signal CTR' which are used to instruct the phase interpolation circuits 21e and 21f as described below. Note that the signals SEL1' and SEL2' and the signal CTR' have the same format as that of the signals SEL1 and SEL2 and the signal CTR, and an alphabetical letter in parentheses indicates to which phase interpolation circuit 21a signal is sent.

Signal SELF (e)=Signal SEL2(d)+1
Signal SEL2'(e)=Signal SEL1(d)
Signal CTR'(e)=Inverted Version of Signal CTR(d)
Signal SELF (f)=Signal SEL1(d)+1
Signal SEL2'(f)=Signal SEL2(d)+1
Signal CTR'(f)=Signal CTR(d)

For example, when the value of the signal SEL1(d) is "100," the value of the signal SEL2(d) is "001," and the value of the signal CTR(d) is "1111," the value of the signal SEL1'(e) is "100," the value of the signal SEL2'(e) is "100," and the value of the signal CTR'(e) is "0000." Also, the value of the signal SELF (f) is "010," the value of the signal SEL2'(f) is "100," and the value of the signal CTR'(f) is "1111." As a result, the phase interpolation circuits 21d-21f select the clock signals CK2, CK4, and CK0, respectively, which are then output as the clock signals PCK3-PCK5, respectively. Therefore, the phase interval of the clock signals PCK3-PCK5 is T/3.

Thus, according to this embodiment, the phase determination process can be performed based on the outputs of the same sampler circuits 31 in both of the operation modes. In other words, in the phase determination process, it is not necessary to change the outputs of the sampler circuits 31, depending on the operation mode, and therefore, the configuration of the phase control circuit 40 can be simplified.

Here, if it is assumed that the number of bits which are processed in parallel is D and the numbers of the phase interpolation circuits 21 and the sampler circuits 31 are n, there are D sampler circuit groups each including n/D sampler circuits 31. In this case, when the operation mode is "H," any of the D sampler circuit groups may be used in the phase determination. For example, in the configuration of FIG. 9, the phase control circuit 40, when the operation mode is "H," may perform the phase determination based on the outputs of the sampler circuits 31a-31c included in a single sampler circuit group. The phase conversion circuit 50 may, for example, generate the signals SELF (b), SEL2'(b), and CTR'(b), and SELF (c), SEL2'(c), and CTR'(c) based on the signals SEL1(a), SEL2(a), and CTR(a) using the above expressions.

Specifically, the phase conversion circuit 50, when the operation mode is "H," may convert the instruction from the phase control circuit 40 into an instruction to the phase interpolation circuits 21 corresponding to the sampler circuits 31 used in the phase determination to output sample timing signals whose phases are separated by D×T/n from each other.

In this embodiment, the numbers of the phase interpolation circuits 21 and the sampler circuits 31 may not be (the oversampling rate)×(the number of bits which are processed in parallel when the operation mode is "L").

Figure 11:
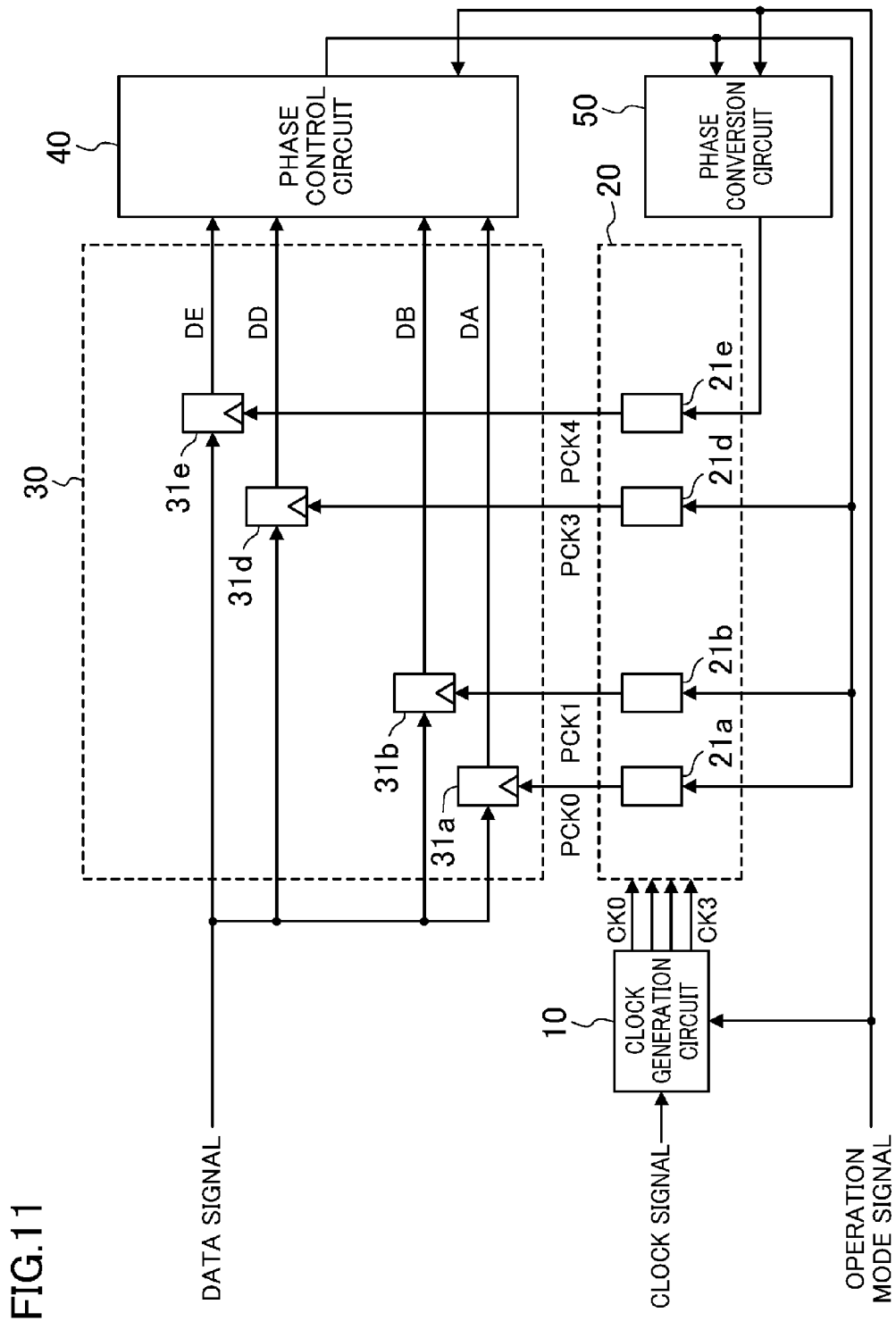
FIG. 11 is a diagram showing another configuration of the timing recovery circuit of the second embodiment.

Specifically, a configuration shown in FIG. 11 may be employed. Specifically, the phase conversion circuit 50 may be added to the configuration of FIG. 9, and may convert an instruction which the phase control circuit 40 gives to the phase interpolation circuit 21e. In this timing recovery circuit, the phase control circuit 40, when the operation mode is "L," may perform the phase determination, two bits at a time, using the signals DA, DB, and DD and the signals DD, DE, and DA', and when the operation mode is "H," may perform the phase determination, one bit at a time, using the signals DD, DE, and DD'. Here, the signal DA' is a signal which is latched in the sampler circuit 31a one cycle after the signal DA. The signal DD' is a signal which is latched in the sampler circuit 31d one cycle after the signal DD. In this timing recovery circuit, the clock signals PCK0, PCK1, PCK3, and PCK4 preferably have equal phase intervals.

Referring back to FIG. 10, this embodiment is applicable to a case where, when the operation mode is "L," the clock signals PCK0-PCK5 do not have equal phase intervals, such as a case where any of the phase intervals of the clock signals PCK0-PCK5 that has a dead zone is narrowed.

A case where the clock generation circuit 10 generates 10 clock signals CK0-CK9 and the phase interpolation circuits 21a-21f output the clock signals PCK0-PCK5 based on the clock signals CK0-CK9 will be described.

Specifically, the phase interpolation circuits 21a-21f are assumed to receive the clock signals CK0-CK9 in the following order.

Phase interpolation circuit 21a: {CK0, CK1, CK2, . . . , CK9}
Phase interpolation circuit 21b: {CK2, CK3, CK4, . . . , CK9, CK0, CK1}
Phase interpolation circuit 21c: {CK4, CK5, CK6, . . . , CK9, CK0, . . . , CK3}
Phase interpolation circuit 21d: {CK5, CK6, CK7, . . . , CK9, CK0, . . . , CK4}
Phase interpolation circuit 21e: {CK7, CK8, CK9, . . . , CK9, CK0, . . . , CK6}
Phase interpolation circuit 21f: {CK9, CK0, CK1, . . . , CK8}

In this case, when the operation mode is "L," then if the phase interpolation circuits 21a-21f receive the same instruction from the phase control circuit 40, the phase interpolation circuits 21a-21f in the initial state selectively output the clock signals CK0, CK2, CK4, CK5, CK7, and CK9, respectively. Therefore, the phase intervals of the clock signals PCK0-PCK2 and the phase intervals of the clock signals PCK3-PCK5 are 2P/5, and the phase intervals of the clock signals PCK2 and PCK3 and the phase intervals of the clock signals PCK5 and PCK0 are P/5. The phase intervals which are P/5 each correspond to a dead zone.

With such a configuration, when the operation mode is "H," the phase conversion circuit 50 may convert the instruction from the phase control circuit 40 into an instruction to the phase interpolation circuits 21e and 21f to generate the clock signals PCK4 and PCK5 whose phase interval is k times as long as the phase interval of the clock signals PCK4 and PCK5 which occur when the operation mode is "L." Here, k is the number of bits of the data signal which are processed in parallel when the operation mode is "L."

Therefore, in the above example, when the operation mode is "L," the phase interval of the clock signals PCK3, PCK4, and PCK5 is the same as that of the clock signals CK5, CK7, and CK9, and corresponds to two phases of the clock signal output from the clock generation circuit 10. Because k=2, the instruction from the phase control circuit 40 may be converted into an instruction to cause the phase interval of the clock signals PCK4 and PCK5 to correspond to four phases of the clock signal output from the clock generation circuit 10, i.e., to be equal to the phase interval of the clock signals CK9 and CK3, when the operation mode is "H." As a result, the data signal can be oversampled at intervals of 2P/5 irrespective of the operation mode.

The conversion process of the instruction from the phase control circuit 40 which is performed by the phase conversion circuit 50 can be performed by a simple numerical operation, and therefore, the phase intervals of the clock signals PCK0-PCK5 can be easily set to any value. The clock signals PCK0-PCK5 can also be easily controlled to have different phase intervals in the different operation modes.

<First Application>

Figure 12:
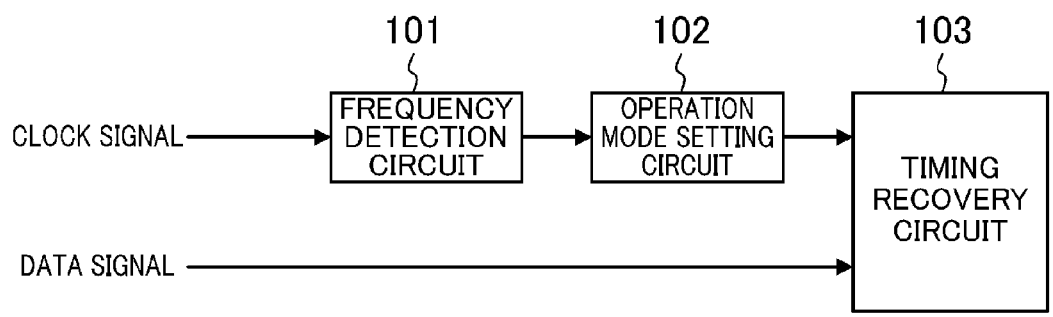
FIG. 12 is a diagram showing a configuration of a signal receiver system according to a first application.

FIG. 12 is a diagram showing an example configuration of a signal receiver system according to a first application. The signal receiver system is, for example, a receiver circuit, and is applicable to an interface, such as HDMI etc., through which a data signal and a clock signal can be simultaneously transmitted.

The receiver circuit includes a frequency detection circuit 101, an operation mode setting circuit 102, and a timing recovery circuit 103. Note that the timing recovery circuit 103 is any of the above timing recovery circuits.

The frequency detection circuit 101 detects the frequency of a received clock signal. The operation mode setting circuit 102 generates and outputs an operation mode signal which takes, for example, a high value ("H") or a low value ("L"), based on the result of the frequency detection. The timing recovery circuit 103 receives the operation mode signal and performs the above process based on the operation mode signal.

The frequency detection circuit 101 may detect the frequency using, for example, a technique of measuring the number of cycles of the received clock signal during a predetermined period of time. By using the result of this measurement, the frequency of a clock signal generated by the clock generation circuit 10 in the timing recovery circuit 103 can be easily determined. In other words, the frequency detection circuit 101 can determine the transmission rate of the data signal based on the frequency of the received clock signal. Therefore, the operation mode setting circuit 102 may generate an operation mode signal whose value is "L" when the frequency is within the operating range of the phase division circuit (see, for example, FIG. 3) and "H" otherwise.

<Second Application>

Figure 13:
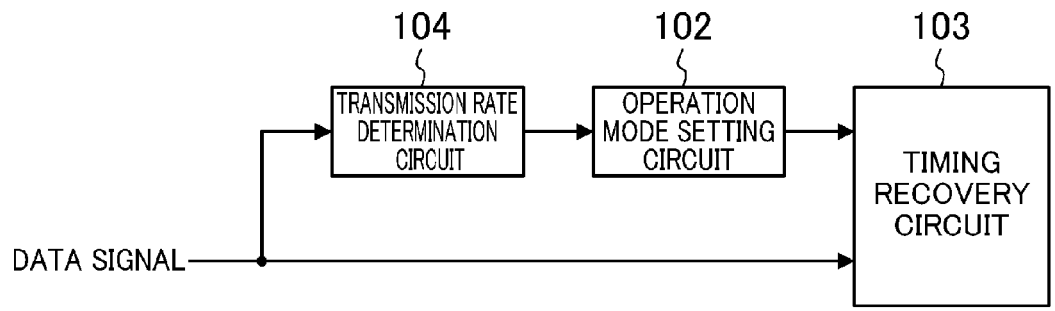
FIG. 13 is a diagram showing a configuration of a signal receiver system according to a second application.
Figure 14:
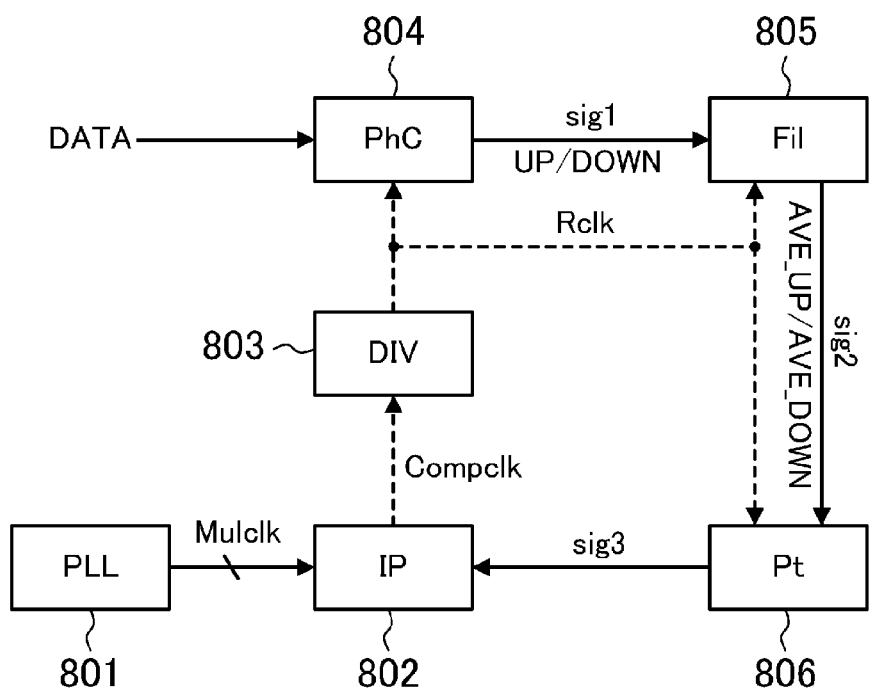
FIG. 14 is a diagram showing a configuration of a conventional timing recovery circuit.
Figure 15:
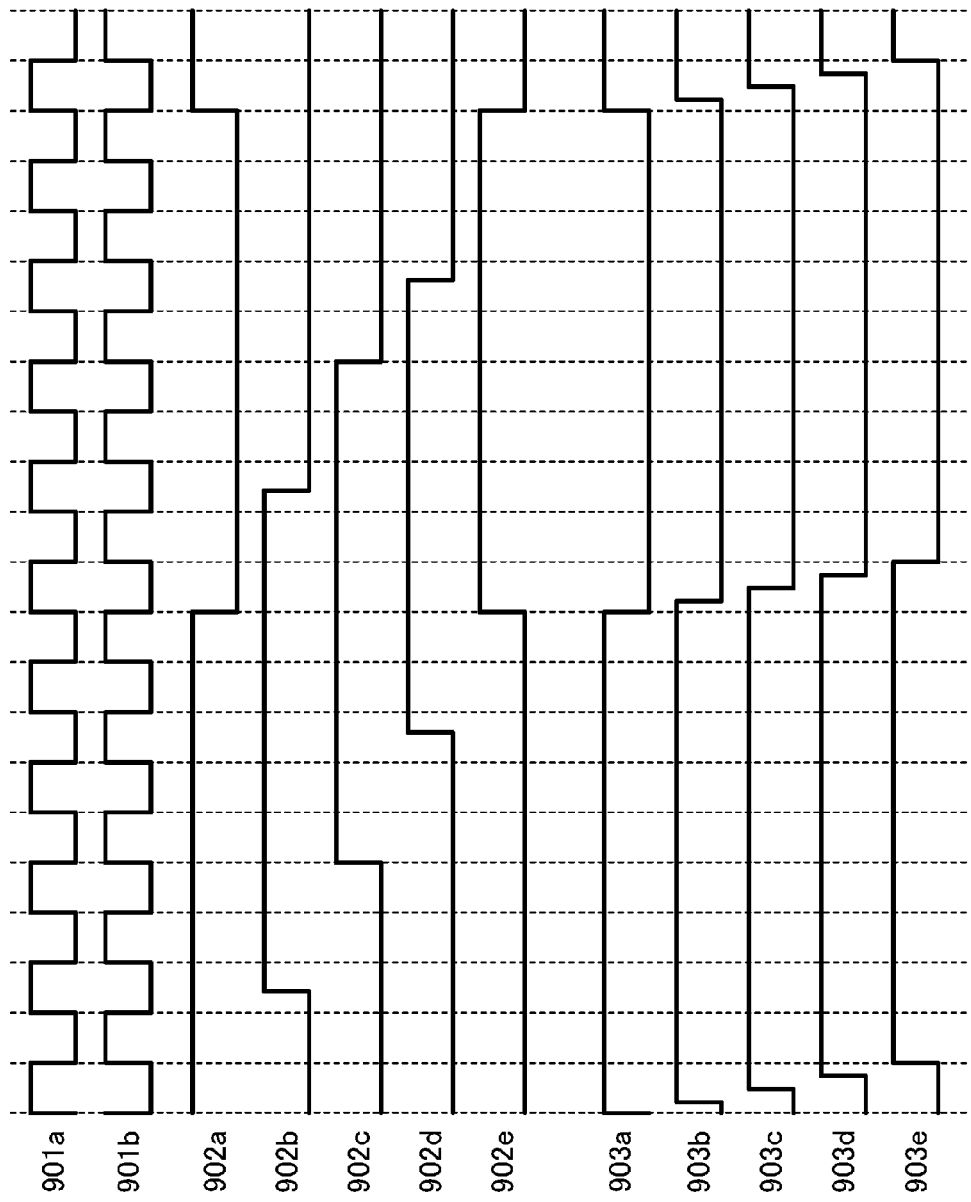
FIG. 15 is a timing chart for describing phase division operation performed in a conventional timing recovery circuit.

FIG. 13 is a diagram showing an example configuration of a signal receiver system according to a second application. This signal receiver system is, for example, a receiver circuit, and is applicable to an interface through which a clock signal is not transmitted along with the data signal. Note that the same reference characters in FIGS. 12 and 13 indicate the same components.

In the configuration of FIG. 13, a clock signal is not transmitted, and therefore, it is necessary to detect the transmission rate using a transmission rate detection circuit 104. Typically, in a communication protocol which has a variable transmission rate, the transmission rate may be detected, for example, by setting the potential of a transmission line to a different predetermined potential for each transmission rate before transmission of a data signal, or by continuing to transmit a tone signal having a different pulse width or generation pattern during a predetermined period of time.

The transmission rate detection circuit 104 is a circuit which recognizes a signal for detecting the transmission rate as described above. Therefore, the operation mode setting circuit 102 may generate a predetermined operation mode signal based on the result of the recognition.

As described above, a receiver circuit which can handle a broader band by detecting the transmission rate based on a received signal and setting the operation mode, can be provided.

Note that, in the above embodiments, the operation mode signal may be input to each of the phase interpolation circuits 21a-21f. In this case, each of the phase interpolation circuits 21a-21f may perform the above operation, depending on the operation mode. For example, each of the phase interpolation circuits 21a-21f operates as a selector when the operation mode signal is high ("H").

The timing recovery circuit according to the present disclosure can handle a broader-band transmission rate while maintaining good phase tracking performance, and therefore, is particularly useful as an interface which is used for communication of video data having various formats.

What is claimed is:

1. A timing recovery circuit for controlling a timing of latching a received data signal, the timing recovery circuit being allowed to switch between a first operation mode and a second operation mode, the circuit comprising:

a clock generation circuit configured to generate n clock signals having phases separated by T/n from each other, where T is the period of the n clock signals, n is an integer of D or more, and D is an integer of two or more, wherein the period T is D times as long as the 1-bit length of the data signal in the first operation mode and is equal to the 1-bit length of the data signal in the second operation mode;

at least D phase interpolation circuits each configured to select two of the n clock signals as a first and a second clock signal, and generate a sample timing signal having a phase adjusted to fall between the phases of the first and second clock signals in the first operation mode, and output one of the first and second clock signals as a sample timing signal in the second operation mode;

a plurality of sampler circuits provided, respectively corresponding to the at least D phase interpolation circuits, and each configured to latch the data signal in synchronization with the sample timing signal output from a corresponding one of the at least D phase interpolation circuits; and a phase control circuit configured to determine the phases of the sample timing signals based on outputs of the plurality of sampler circuits, and instruct the at least D phase interpolation circuits to select the first and second clock signals based on the result of the phase determination, and instruct the at least D phase interpolation circuits to adjust the phases of the sample timing signals in the first operation mode, and to select one of the first and second clock signals in the second operation mode.

2. The timing recovery circuit of claim 1, wherein the at least D phase interpolation circuits each include a first selector configured to selectively output one of the n clock signals as the first clock signal, a second selector configured to selectively output one of the n clock signals as the second clock signal, and a phase division circuit configured to receive the first and second clock signals, and generate and output the sample timing signal having a phase adjustable between the phases of the first and second clock signals in the first operation mode, and output one of the first and second clock signals as the sample timing signal in the second operation mode, and the phase control circuit includes a first designation circuit configured to designate, to the first selector, a clock signal which is to be selected as the first clock signal, based on the result of the phase determination, a second designation circuit configured to designate, to the second selector, a clock signal having a phase separated by T/n from the phase of the clock signal designated by the first designation circuit to the first selector, as the second clock signal, and a phase division instruction circuit configured to instruct the phase division circuit to adjust the phase of the sample timing signal based on the result of the phase determination in the first operation mode, and to directly select one of the first and second clock signals in the second operation mode.

3. The timing recovery circuit of claim 1, wherein the at least D phase interpolation circuits each include a first selector configured to receive n/2 clock signals having phases separated by (2×T/n) from each other of the n clock signals, where n is an even number, and selectively output one of the received clock signals as the first clock signal, a second selector configured to receive n/2 clock signals excluding the clock signals received by the first selector, of the n clock signals, and selectively output one of the received clock signals as the second clock signal, and a phase division circuit configured to receive the first and second clock signals, and generate and output the sample timing signal having a phase adjustable between the phases of the first and second clock signals in the first operation mode, and output one of the first and second clock signals as the sample timing signal in the second operation mode, and the phase control circuit includes a first designation circuit configured to designate, to the first selector, a clock signal which is to be selected as the first clock signal, based on the result of the phase determination, a second designation circuit configured to designate, to the second selector, a clock signal having a phase separated by T/n from the phase of the clock signal designated by first designation circuit to the first selector, as the second clock signal, and a phase division instruction circuit configured to instruct the phase division circuit to adjust the phases of the sample timing signals based on the result of the phase determination in the first operation mode, and to select one of the first and second clock signals in the second operation mode.

4. The timing recovery circuit of claim 1, comprising:
a first to an n-th phase interpolation circuit, where n is an integer multiple of D, as the at least D phase interpolation circuits;
a first to an n-th sampler circuit as the plurality of sampler circuits; and a phase conversion circuit configured to directly relay the instruction from the phase control circuit in the first operation mode, and convert the instruction from the phase control circuit in the second operation mode, wherein in the first operation mode, for D sampler circuit groups including n/D sampler circuits, the phase control circuit performs the phase determination in parallel, D bits at a time, using outputs of the sampler circuits included in each of the sampler circuit groups, and based on the result of the phase determination, instructs the first to n-th phase interpolation circuits to select two clock signals having phases separated by T/n from each other as the first and second clock signals, in the second operation mode, the phase control circuit performs the phase determination, one bit at a time, using outputs of the n/D sampler circuits included in any of the D sampler circuit groups, and based on the result of the phase determination, instructs n/D phase interpolation circuits corresponding to the n/D sampler circuits involved in the phase determination to select two clock signals having phases separated by T/n from each other as the first and second clock signals, and output the sample timing signals having phases separated by T/n from each other, and in the second operation mode, the phase conversion circuit converts the instruction from the phase control circuit to (n/D−1) of the n/D phase interpolation circuits so the n/D phase interpolation circuits designated by the phase control circuit output the sample timing signals having phases separated by D×T/n from each other.

5. The timing recovery circuit of claim 1, comprising:
a first to an m-th phase interpolation circuit, where m is an integer of D or more, as the at least D phase interpolation circuits;
a first to an m-th sampler circuit as the plurality of sampler circuits; and
a phase conversion circuit configured to directly relay the instruction from the phase control circuit in the first operation mode, and convert the instruction from the phase control circuit in the second operation mode, wherein in the first operation mode, the phase control circuit performs the phase determination based on outputs of the first to m-th sampler circuits, and based on the result of the phase determination, instructs the first to m-th phase interpolation circuits to select two clock signals having phases separated by T/n from each other as the first and second clock signals, in the second operation mode, the phase control circuit performs the phase determination based on outputs of the (m−2)th to m-th sampler circuits, and based on the result of the phase determination, instructs the (m−2)th to m-th phase interpolation circuits to select two clock signals having phases separated by T/n from each other as the first and second clock signals, and output the sample timing signals having phases separated by T/n from each other, and in the second operation mode, the phase conversion circuit converts the instruction from the phase control circuit to the (m−1)th and m-th phase interpolation circuits so the (m−2)th to m-th phase interpolation circuits output the sample timing signals having phases separated by an integer multiple of T/n from each other.

6. The timing recovery circuit of claim 1, wherein there are at least four of the phase interpolation circuits and at least four of the sampler circuits.

7. The timing recovery circuit of claim 1, wherein
the transmission rate of the data signal in the first operation mode is higher than the transmission rate of the data signal in the second operation mode.

8. A receiver circuit comprising:
the timing recovery circuit of claim 1;
a transmission rate determination circuit configured to determine the transmission rate of the data signal based on a received signal; and
an operation mode setting circuit configured to generate an operation mode signal indicating the operation mode of the timing recovery circuit based on the result of the determination performed by the transmission rate determination circuit,
wherein
the timing recovery circuit changes the first and second operation modes, depending on the operation mode signal.

9. The receiver circuit of claim 8, wherein
the transmission rate determination circuit receives a clock signal as the signal, and determines the transmission rate of the data signal by detecting the frequency of the clock signal.

10. The receiver circuit of claim 8, wherein
the transmission rate determination circuit receives the data signal as the signal.

* * * * *